US012362646B2

(12) United States Patent
Baker et al.

(10) Patent No.: US 12,362,646 B2
(45) Date of Patent: Jul. 15, 2025

(54) CONTROLLING AC POWER TO INDUCTIVE LOADS

(71) Applicant: Amber Semiconductor, Inc., Dublin, CA (US)

(72) Inventors: Damon Matthew Baker, Elsinore, UT (US); Kenneth Darrell Alton, Austin, TX (US); Mark Telefus, Orinda, CA (US)

(73) Assignee: Amber Semiconductor, Inc., Dublin, CA (US)

( * ) Notice: Subject to any disclaimer, the term of this patent is extended or adjusted under 35 U.S.C. 154(b) by 393 days.

(21) Appl. No.: 18/102,062

(22) Filed: Jan. 26, 2023

(65) Prior Publication Data

US 2023/0261560 A1 Aug. 17, 2023

Related U.S. Application Data

(60) Provisional application No. 63/303,492, filed on Jan. 26, 2022.

(51) Int. Cl.
*H02M 1/00* (2007.01)
*G01R 19/165* (2006.01)
(Continued)

(52) U.S. Cl.
CPC .... *H02M 1/0058* (2021.05); *G01R 19/16576* (2013.01); *G01R 19/175* (2013.01); *H02M 1/32* (2013.01); *H05B 47/10* (2020.01)

(58) Field of Classification Search
CPC ...... H02M 1/0058; H02M 1/32; H05B 47/10; G01R 19/175; G01R 19/16576
See application file for complete search history.

(56) References Cited

U.S. PATENT DOCUMENTS 3,638,102 A 1/1972 Pelka
3,777,253 A 12/1973 Callan
(Continued)

FOREIGN PATENT DOCUMENTS

CN 109075551 B 1/2021
DE 19712261 A1 10/1998
(Continued)

OTHER PUBLICATIONS

K. Yang et al. "Series Arc Fault Detection Algorithm Based on Autoregressive Bispecturm Analysis," Algorithms, vol. 8, Oct. 16, 2015, pp. 929-950.
(Continued)

*Primary Examiner* — Rafael O De Leon Domenech
(74) *Attorney, Agent, or Firm* — Ryan, Mason & Lewis, LLP

(57) ABSTRACT

Techniques are provided for controlling alternating current (AC) power which is supplied to an inductive load by an AC switch. For example, the AC power is controlled by a process which comprises detecting zero-voltage crossings of an AC voltage waveform of the AC power, monitoring a load voltage to detect for a presence of inductive flyback voltage when the AC switch is placed into a turned-off state, and determining a delay time to place the AC switch into the turned-off state subsequent to a detected zero-voltage crossing of the AC voltage waveform, when inductive flyback voltage is detected in the load voltage, so that the AC switch is placed into the turned-off state at a time which substantially coincides with a zero-current crossing of load current of the inductive load, to thereby suppress the generation of inductive flyback voltage when the AC switch is placed into the turned-off state.

20 Claims, 6 Drawing Sheets

(51) Int. Cl.
*G01R 19/175* (2006.01)
*H02M 1/32* (2007.01)
*H05B 47/10* (2020.01)

(56) References Cited

U.S. PATENT DOCUMENTS

| | | | |
|---|---|---|---|
| 4,074,345 A | 2/1978 | Ackermann |
| 4,127,895 A | 11/1978 | Krueger |
| 4,245,148 A | 1/1981 | Gisske et al. |
| 4,245,184 A | 1/1981 | Billings et al. |
| 4,245,185 A | 1/1981 | Mitchell et al. |
| 4,257,081 A | 3/1981 | Sauer et al. |
| 4,466,071 A | 8/1984 | Russell, Jr. |
| 4,487,458 A | 12/1984 | Janutka |
| 4,581,540 A | 4/1986 | Guajardo |
| 4,631,625 A | 12/1986 | Alexander et al. |
| 4,636,907 A | 1/1987 | Howell |
| 4,641,233 A | 2/1987 | Roy |
| 4,649,302 A | 3/1987 | Damiano et al. |
| 4,653,084 A | 3/1987 | Ahuja |
| 4,682,061 A | 7/1987 | Donovan |
| 4,685,046 A | 8/1987 | Sanders |
| 4,709,296 A | 11/1987 | Hung et al. |
| 4,760,293 A | 7/1988 | Hebenstreit |
| 4,766,281 A | 8/1988 | Buhler |
| 4,806,844 A | 2/1989 | Claydon et al. |
| 4,812,995 A | 3/1989 | Girgis et al. |
| 4,888,504 A | 12/1989 | Kinzer |
| 4,945,345 A | 7/1990 | Proctor et al. |
| 5,041,960 A | 8/1991 | Tseruel |
| 5,118,993 A | 6/1992 | Yang |
| 5,121,282 A | 6/1992 | White |
| 5,276,737 A | 1/1994 | Micali |
| 5,307,257 A | 4/1994 | Fukushima |
| 5,371,646 A | 12/1994 | Biegelmeier |
| 5,410,745 A | 4/1995 | Friesen et al. |
| 5,559,656 A | 9/1996 | Chokhawala |
| 5,646,514 A | 7/1997 | Tsunetsugu |
| 5,654,880 A | 8/1997 | Brkovic et al. |
| 5,731,732 A | 3/1998 | Williams |
| 5,793,596 A | 8/1998 | Jordan et al. |
| 5,796,274 A | 8/1998 | Willis et al. |
| 5,801,933 A | 9/1998 | Ravid |
| 5,844,759 A | 12/1998 | Hirsh et al. |
| 5,859,756 A | 1/1999 | Pressman et al. |
| 5,870,009 A | 2/1999 | Serpinet et al. |
| 5,933,305 A | 8/1999 | Schmalz et al. |
| 6,081,123 A | 6/2000 | Kasbarian et al. |
| 6,111,494 A | 8/2000 | Fischer et al. |
| 6,111,733 A | 8/2000 | Neiger et al. |
| 6,115,267 A | 9/2000 | Herbert |
| 6,141,197 A | 10/2000 | Kim et al. |
| 6,160,689 A | 12/2000 | Stolzenberg |
| 6,167,329 A | 12/2000 | Engel et al. |
| 6,169,391 B1 | 1/2001 | Lei |
| 6,188,203 B1 | 2/2001 | Rice et al. |
| 6,282,109 B1 | 8/2001 | Fraidlin et al. |
| 6,300,748 B1 | 10/2001 | Miller |
| 6,369,554 B1 | 4/2002 | Aram |
| 6,437,955 B1 | 8/2002 | Duffy et al. |
| 6,483,290 B1 | 11/2002 | Hemminger et al. |
| 6,515,434 B1 | 2/2003 | Biebl |
| 6,538,906 B1 | 3/2003 | Ke et al. |
| 6,788,512 B2 | 9/2004 | Vicente et al. |
| 6,807,035 B1 | 10/2004 | Baldwin et al. |
| 6,813,720 B2 | 11/2004 | Leblanc |
| 6,839,208 B2 | 1/2005 | Macbeth et al. |
| 6,843,680 B2 | 1/2005 | Gorman |
| 6,906,476 B1 | 6/2005 | Beatenbough et al. |
| 6,984,988 B2 | 1/2006 | Yamamoto |
| 7,045,723 B1 | 5/2006 | Projkovski |
| 7,053,626 B2 | 5/2006 | Monter et al. |
| 7,110,225 B1 | 9/2006 | Hick |
| 7,136,265 B2 | 11/2006 | Wong et al. |
| 7,164,238 B2 | 1/2007 | Kazanov et al. |
| 7,292,419 B1 | 11/2007 | Nemir |
| 7,297,603 B2 | 11/2007 | Robb et al. |
| 7,304,828 B1 | 12/2007 | Shvartsman |
| D558,683 S | 1/2008 | Pape et al. |
| 7,319,574 B2 | 1/2008 | Engel |
| D568,253 S | 5/2008 | Gorman |
| 7,367,121 B1 | 5/2008 | Gorman |
| 7,586,285 B2 | 9/2009 | Gunji |
| 7,595,680 B2 | 9/2009 | Morita et al. |
| 7,596,004 B2 | 9/2009 | Grbovic |
| 7,633,727 B2 | 12/2009 | Zhou et al. |
| 7,643,256 B2 | 1/2010 | Wright et al. |
| 7,693,670 B2 | 4/2010 | Durling et al. |
| 7,715,216 B2 | 5/2010 | Liu et al. |
| 7,729,147 B1 | 6/2010 | Wong et al. |
| 7,731,403 B2 | 6/2010 | Lynam et al. |
| 7,746,677 B2 | 6/2010 | Unkrich |
| 7,821,023 B2 | 10/2010 | Yuan et al. |
| D638,355 S | 5/2011 | Chen |
| 7,936,279 B2 | 5/2011 | Tang et al. |
| 7,948,719 B2 | 5/2011 | Xu |
| 8,124,888 B2 | 2/2012 | Etemad-Moghadam et al. |
| 8,174,804 B2 | 5/2012 | Fasano |
| 8,184,419 B2 | 5/2012 | Peng |
| 8,256,675 B2 | 9/2012 | Baglin et al. |
| 8,295,950 B1 | 10/2012 | Wordsworth et al. |
| 8,374,729 B2 | 2/2013 | Chapel et al. |
| 8,463,453 B2 | 6/2013 | Parsons, Jr. |
| 8,482,885 B2 | 7/2013 | Billingsley et al. |
| 8,560,134 B1 | 10/2013 | Lee |
| 8,649,883 B2 | 2/2014 | Lu et al. |
| 8,664,886 B2 | 3/2014 | Ostrovsky |
| 8,717,720 B2 | 5/2014 | DeBoer |
| 8,718,830 B2 | 5/2014 | Smith |
| 8,737,030 B2 | 5/2014 | Valdes |
| 8,781,637 B2 | 7/2014 | Eaves |
| 8,817,441 B2 | 8/2014 | Callanan |
| 8,890,371 B2 | 11/2014 | Gotou |
| D720,295 S | 12/2014 | Dodal et al. |
| 8,947,838 B2 | 2/2015 | Yamai et al. |
| 9,054,587 B2 | 6/2015 | Neyman |
| 9,055,641 B2 | 6/2015 | Shteynberg et al. |
| 9,237,617 B1 | 1/2016 | Xiong |
| 9,287,792 B2 | 3/2016 | Telefus et al. |
| 9,325,516 B2 | 4/2016 | Pera et al. |
| 9,366,702 B2 | 6/2016 | Steele et al. |
| 9,439,318 B2 | 9/2016 | Chen |
| 9,443,845 B1 | 9/2016 | Stafanov et al. |
| 9,502,832 B1 | 11/2016 | Ullahkhan et al. |
| 9,509,083 B2 | 11/2016 | Yang |
| 9,515,560 B1 | 12/2016 | Telefus et al. |
| 9,577,420 B2 | 2/2017 | Ostrovsky et al. |
| 9,608,430 B2 | 3/2017 | Duan et al. |
| 9,621,053 B1 | 4/2017 | Telefus |
| 9,755,630 B2 | 9/2017 | Urciuoli |
| 9,759,758 B2 | 9/2017 | Ostrovsky et al. |
| 9,774,182 B2 | 9/2017 | Phillips |
| 9,836,243 B1 | 12/2017 | Chanler et al. |
| 9,883,554 B2 | 1/2018 | Lynch |
| 9,899,931 B1 * | 2/2018 | Chang ............... H02M 3/33592 |
| D814,424 S | 4/2018 | DeCosta |
| 9,965,007 B2 | 5/2018 | Amelio et al. |
| 9,978,553 B2 | 5/2018 | Tomimbang et al. |
| 9,991,633 B2 | 6/2018 | Robinet |
| 9,991,800 B2 * | 6/2018 | Hari ............... H02M 3/33507 |
| 10,072,942 B2 | 9/2018 | Wootton et al. |
| 10,076,006 B2 | 9/2018 | Kahlman et al. |
| 10,101,716 B2 | 10/2018 | Kim |
| 10,135,235 B2 | 11/2018 | Cui et al. |
| 10,187,944 B2 | 1/2019 | MacAdam et al. |
| 10,243,350 B2 | 3/2019 | Pan et al. |
| 10,469,077 B2 | 11/2019 | Telefus et al. |
| 10,548,188 B2 | 1/2020 | Cheng et al. |
| D879,056 S | 3/2020 | Telefus |
| D881,144 S | 4/2020 | Telefus |
| 10,615,713 B2 | 4/2020 | Telefus et al. |
| 10,756,662 B2 | 8/2020 | Steiner et al. |
| 10,812,072 B2 | 10/2020 | Telefus et al. |
| 10,812,282 B2 | 10/2020 | Telefus et al. |

(56) References Cited

U.S. PATENT DOCUMENTS

| | | |
|---|---|---|
| 10,819,336 B2 | 10/2020 | Telefus et al. |
| 10,834,792 B2 | 11/2020 | Telefus et al. |
| 10,931,473 B2 | 2/2021 | Telefus et al. |
| 10,985,548 B2 | 4/2021 | Telefus |
| 10,992,236 B2 | 4/2021 | Telefus et al. |
| 11,050,236 B2 | 6/2021 | Telefus et al. |
| 11,056,981 B2 | 7/2021 | Telefus |
| 11,064,586 B2 | 7/2021 | Telefus et al. |
| 11,114,947 B2 | 9/2021 | Telefus et al. |
| 11,170,964 B2 | 11/2021 | Telefus et al. |
| 11,201,460 B2 | 12/2021 | Oishi et al. |
| 11,245,339 B2 | 2/2022 | Telefus et al. |
| 11,336,199 B2 | 5/2022 | Telefus et al. |
| 11,342,151 B2 | 5/2022 | Telefus et al. |
| 11,342,735 B2 | 5/2022 | Telefus et al. |
| 11,348,752 B2 | 5/2022 | Telefus et al. |
| 11,349,296 B2 | 5/2022 | Telefus |
| 11,349,297 B2 | 5/2022 | Telefus et al. |
| 11,363,690 B2 | 6/2022 | Telefus et al. |
| 11,373,831 B2 | 6/2022 | Telefus et al. |
| 11,422,520 B2 | 8/2022 | Telefus et al. |
| 11,551,899 B2 | 1/2023 | Telefus et al. |
| 11,581,725 B2 | 2/2023 | Telefus |
| 11,670,946 B2 | 6/2023 | Telefus et al. |
| 11,671,029 B2 | 6/2023 | Telefus |
| 11,682,891 B2 | 6/2023 | Telefus et al. |
| 11,721,508 B2 | 8/2023 | Telefus et al. |
| 11,764,565 B2 | 9/2023 | Telefus |
| 11,791,616 B2 | 10/2023 | Telefus |
| 2002/0109487 A1 | 8/2002 | Telefus et al. |
| 2003/0052544 A1 | 3/2003 | Yamamoto et al. |
| 2003/0063420 A1 | 4/2003 | Pahl et al. |
| 2003/0125885 A1 | 7/2003 | Dougherty et al. |
| 2003/0151865 A1 | 8/2003 | Maio |
| 2004/0032756 A1 | 2/2004 | Van Den Bossche |
| 2004/0251884 A1 | 12/2004 | Steffie et al. |
| 2005/0128657 A1 | 6/2005 | Covault |
| 2005/0162139 A1 | 7/2005 | Hirst |
| 2005/0185353 A1 | 8/2005 | Rasmussen et al. |
| 2005/0286184 A1 | 12/2005 | Campolo |
| 2006/0227469 A1 | 10/2006 | Parker et al. |
| 2006/0285366 A1 | 12/2006 | Radecker et al. |
| 2007/0008747 A1 | 1/2007 | Soldano et al. |
| 2007/0018506 A1 | 1/2007 | Paik et al. |
| 2007/0159745 A1 | 7/2007 | Berberich et al. |
| 2007/0188025 A1 | 8/2007 | Keagy et al. |
| 2007/0217237 A1 | 9/2007 | Palestrina |
| 2007/0236152 A1 | 10/2007 | Davis et al. |
| 2008/0006607 A1 | 1/2008 | Boeder et al. |
| 2008/0136581 A1 | 6/2008 | Heilman et al. |
| 2008/0151444 A1 | 6/2008 | Upton |
| 2008/0174922 A1 | 7/2008 | Kimbrough |
| 2008/0180866 A1 | 7/2008 | Wong |
| 2008/0197699 A1 | 8/2008 | Yu et al. |
| 2008/0204950 A1 | 8/2008 | Zhou et al. |
| 2008/0234879 A1 | 9/2008 | Fuller et al. |
| 2008/0246451 A1 | 10/2008 | Dobbins et al. |
| 2008/0253153 A1 | 10/2008 | Wu et al. |
| 2009/0034139 A1 | 2/2009 | Martin |
| 2009/0067201 A1 | 3/2009 | Cai |
| 2009/0168273 A1 | 7/2009 | Yu et al. |
| 2009/0213629 A1 | 8/2009 | Liu et al. |
| 2009/0284385 A1 | 11/2009 | Tang et al. |
| 2010/0091418 A1 | 4/2010 | Xu |
| 2010/0156369 A1 | 6/2010 | Kularatna et al. |
| 2010/0188054 A1 | 7/2010 | Asakura et al. |
| 2010/0191487 A1 | 7/2010 | Rada et al. |
| 2010/0231135 A1 | 9/2010 | Hum et al. |
| 2010/0231373 A1 | 9/2010 | Romp |
| 2010/0244730 A1 | 9/2010 | Nerone |
| 2010/0261373 A1 | 10/2010 | Roneker |
| 2010/0284207 A1 | 11/2010 | Watanabe et al. |
| 2010/0296207 A1 | 11/2010 | Schumacher et al. |
| 2010/0320840 A1 | 12/2010 | Fridberg |
| 2011/0062936 A1 | 3/2011 | Bartelous |
| 2011/0121752 A1 | 5/2011 | Newman, Jr. et al. |
| 2011/0127922 A1 | 6/2011 | Sauerlaender |
| 2011/0156610 A1 | 6/2011 | Ostrovsky et al. |
| 2011/0227615 A1 | 9/2011 | Faison |
| 2011/0273103 A1 | 11/2011 | Hong |
| 2011/0292703 A1 | 12/2011 | Cuk |
| 2011/0301894 A1 | 12/2011 | Sanderford, Jr. |
| 2011/0305054 A1 | 12/2011 | Yamagiwa et al. |
| 2011/0307447 A1 | 12/2011 | Sabaa et al. |
| 2012/0026632 A1 | 2/2012 | Acharya et al. |
| 2012/0075897 A1 | 3/2012 | Fujita |
| 2012/0080942 A1 | 4/2012 | Carralero et al. |
| 2012/0089266 A1 | 4/2012 | Tomimbang et al. |
| 2012/0089366 A1 | 4/2012 | Huyse |
| 2012/0092797 A1 | 4/2012 | Reeder et al. |
| 2012/0095605 A1 | 4/2012 | Tran |
| 2012/0120700 A1 | 5/2012 | Elberbaum |
| 2012/0133289 A1 | 5/2012 | Hum et al. |
| 2012/0275076 A1 | 11/2012 | Shono |
| 2012/0323510 A1 | 12/2012 | Bell et al. |
| 2013/0026925 A1 | 1/2013 | Ven et al. |
| 2013/0033246 A1 | 2/2013 | Krenz et al. |
| 2013/0051102 A1 | 2/2013 | Huang et al. |
| 2013/0057247 A1 | 3/2013 | Russell et al. |
| 2013/0063851 A1 | 3/2013 | Stevens et al. |
| 2013/0066478 A1 | 3/2013 | Smith |
| 2013/0088160 A1 | 4/2013 | Chai et al. |
| 2013/0119958 A1 | 5/2013 | Gasperi |
| 2013/0128396 A1 | 5/2013 | Danesh et al. |
| 2013/0170261 A1 | 7/2013 | Lee et al. |
| 2013/0176758 A1 | 7/2013 | Tseng et al. |
| 2013/0187631 A1 | 7/2013 | Russell et al. |
| 2013/0253898 A1 | 9/2013 | Meagher et al. |
| 2013/0261821 A1 | 10/2013 | Lu et al. |
| 2013/0265041 A1 | 10/2013 | Friedrich et al. |
| 2013/0329331 A1 | 12/2013 | Erger et al. |
| 2014/0043732 A1 | 2/2014 | McKay et al. |
| 2014/0067137 A1 | 3/2014 | Amelio et al. |
| 2014/0085940 A1 | 3/2014 | Lee et al. |
| 2014/0097809 A1 | 4/2014 | Follic et al. |
| 2014/0159593 A1 | 6/2014 | Chu et al. |
| 2014/0164294 A1 | 6/2014 | Osann, Jr. |
| 2014/0203718 A1 | 7/2014 | Yoon et al. |
| 2014/0268935 A1 | 9/2014 | Chiang |
| 2014/0268956 A1 | 9/2014 | Teren et al. |
| 2014/0276753 A1 | 9/2014 | Wham et al. |
| 2014/0365490 A1 | 12/2014 | Yang et al. |
| 2015/0042274 A1 | 2/2015 | Kim et al. |
| 2015/0055261 A1 | 2/2015 | Lubicki et al. |
| 2015/0097430 A1 | 4/2015 | Scruggs |
| 2015/0116886 A1 | 4/2015 | Zehnder et al. |
| 2015/0155789 A1 | 6/2015 | Freeman et al. |
| 2015/0162821 A1* | 6/2015 | Wu .............. H02M 1/4258 363/21.17 |
| 2015/0180469 A1 | 6/2015 | Kim |
| 2015/0185262 A1 | 7/2015 | Song et al. |
| 2015/0216006 A1 | 7/2015 | Lee et al. |
| 2015/0236587 A1 | 8/2015 | Kim et al. |
| 2015/0256355 A1 | 9/2015 | Pera et al. |
| 2015/0256665 A1 | 9/2015 | Pera et al. |
| 2015/0317326 A1 | 11/2015 | Bandarupalli et al. |
| 2016/0057841 A1 | 2/2016 | Lenig |
| 2016/0069933 A1 | 3/2016 | Cook et al. |
| 2016/0077746 A1 | 3/2016 | Muth et al. |
| 2016/0081143 A1 | 3/2016 | Wang |
| 2016/0126031 A1 | 5/2016 | Wootton et al. |
| 2016/0178691 A1 | 6/2016 | Simonin |
| 2016/0181941 A1 | 6/2016 | Gratton et al. |
| 2016/0195864 A1 | 7/2016 | Kim |
| 2016/0247799 A1 | 8/2016 | Stafanov et al. |
| 2016/0294179 A1 | 10/2016 | Kennedy et al. |
| 2016/0360586 A1 | 12/2016 | Yang et al. |
| 2016/0381754 A1 | 12/2016 | Chou et al. |
| 2017/0004948 A1 | 1/2017 | Leyh |
| 2017/0019969 A1 | 1/2017 | O'Neil et al. |
| 2017/0063225 A1 | 3/2017 | Guo et al. |
| 2017/0067961 A1 | 3/2017 | O'Flynn |
| 2017/0086281 A1 | 3/2017 | Avrahamy |
| 2017/0104325 A1 | 4/2017 | Eriksen et al. |

(56) References Cited

U.S. PATENT DOCUMENTS

| | | |
|---|---|---|
| 2017/0105265 A1 | 4/2017 | Sadwick |
| 2017/0168516 A1 | 6/2017 | King |
| 2017/0170730 A1 | 6/2017 | Sugiura |
| 2017/0179946 A1 | 6/2017 | Turvey |
| 2017/0214967 A1 | 7/2017 | Xia et al. |
| 2017/0244241 A1 | 8/2017 | Wilson et al. |
| 2017/0256934 A1 | 9/2017 | Kennedy et al. |
| 2017/0256956 A1 | 9/2017 | Irish et al. |
| 2017/0265287 A1 | 9/2017 | Avrahamy |
| 2017/0277709 A1 | 9/2017 | Strauss et al. |
| 2017/0302084 A1* | 10/2017 | Barrenscheen ....... H02M 3/155 |
| 2017/0314743 A1 | 11/2017 | Del Castillo et al. |
| 2017/0322049 A1 | 11/2017 | Wootton et al. |
| 2017/0322258 A1 | 11/2017 | Miller et al. |
| 2017/0338809 A1 | 11/2017 | Stefanov et al. |
| 2017/0347415 A1 | 11/2017 | Cho et al. |
| 2018/0026534 A1 | 1/2018 | Turcan |
| 2018/0054862 A1 | 2/2018 | Takagimoto et al. |
| 2018/0059175 A1 | 3/2018 | Hase |
| 2018/0115252 A1* | 4/2018 | Chang ............... H02M 3/33592 |
| 2018/0130618 A1 | 5/2018 | Ramirez |
| 2018/0188706 A1 | 7/2018 | Wootton et al. |
| 2018/0201302 A1 | 7/2018 | Sonoda et al. |
| 2018/0285198 A1 | 10/2018 | Dantkale et al. |
| 2018/0307609 A1 | 10/2018 | Qiang et al. |
| 2018/0316179 A1 | 11/2018 | Ofek |
| 2018/0323723 A1 | 11/2018 | Mochizuki |
| 2018/0351342 A1 | 12/2018 | Anderson et al. |
| 2019/0003855 A1 | 1/2019 | Wootton et al. |
| 2019/0052174 A1 | 2/2019 | Gong |
| 2019/0122834 A1 | 4/2019 | Wootton et al. |
| 2019/0140640 A1 | 5/2019 | Telefus et al. |
| 2019/0148931 A1 | 5/2019 | Li |
| 2019/0165691 A1 | 5/2019 | Telefus et al. |
| 2019/0181679 A1 | 6/2019 | Northway et al. |
| 2019/0207375 A1 | 7/2019 | Telefus et al. |
| 2019/0222058 A1 | 7/2019 | Sharifipour |
| 2019/0238060 A1 | 8/2019 | Telefus et al. |
| 2019/0245457 A1 | 8/2019 | Telefus et al. |
| 2019/0280887 A1 | 9/2019 | Telefus et al. |
| 2019/0372331 A1 | 12/2019 | Liu et al. |
| 2020/0007126 A1 | 1/2020 | Telefus et al. |
| 2020/0014301 A1 | 1/2020 | Telefus |
| 2020/0014379 A1 | 1/2020 | Telefus |
| 2020/0044883 A1 | 2/2020 | Telefus et al. |
| 2020/0052607 A1 | 2/2020 | Telefus et al. |
| 2020/0106259 A1 | 4/2020 | Telefus |
| 2020/0106260 A1 | 4/2020 | Telefus |
| 2020/0196412 A1 | 6/2020 | Telefus et al. |
| 2020/0287537 A1 | 9/2020 | Telefus et al. |
| 2020/0328694 A1 | 10/2020 | Telefus et al. |
| 2020/0365345 A1 | 11/2020 | Telefus et al. |
| 2020/0365346 A1 | 11/2020 | Telefus et al. |
| 2020/0365356 A1 | 11/2020 | Telefus et al. |
| 2020/0366078 A1 | 11/2020 | Telefus et al. |
| 2020/0366079 A1 | 11/2020 | Telefus et al. |
| 2021/0014947 A1 | 1/2021 | Telefus et al. |
| 2021/0119528 A1 | 4/2021 | Telefus |
| 2021/0173364 A1 | 6/2021 | Telefus et al. |
| 2021/0226441 A1 | 7/2021 | Telefus et al. |
| 2021/0234356 A1 | 7/2021 | Telefus et al. |
| 2021/0336555 A1 | 10/2021 | Telefus |
| 2021/0345462 A1 | 11/2021 | Telefus et al. |
| 2022/0052533 A1 | 2/2022 | Telefus et al. |
| 2022/0189721 A1 | 6/2022 | Telefus et al. |
| 2022/0255310 A1 | 8/2022 | Telefus |
| 2022/0311350 A1 | 9/2022 | Telefus |
| 2022/0399174 A1 | 12/2022 | Telefus et al. |
| 2022/0416681 A1 | 12/2022 | Telefus |
| 2023/0067227 A1 | 3/2023 | Telefus |
| 2023/0121575 A1 | 4/2023 | Baker |
| 2023/0127078 A1 | 4/2023 | Telefus et al. |
| 2023/0162937 A1 | 5/2023 | Telefus et al. |
| 2023/0253799 A1 | 8/2023 | Telefus et al. |
| 2023/0261560 A1 | 8/2023 | Baker et al. |

FOREIGN PATENT DOCUMENTS

| | | |
|---|---|---|
| EP | 0016646 A1 | 10/1980 |
| EP | 0398026 A2 | 11/1990 |
| EP | 2560063 A1 | 2/2013 |
| GB | 1302357 A | 1/1973 |
| GB | 2458699 A | 9/2009 |
| JP | 06-053779 A | 2/1994 |
| JP | 2001196908 A | 7/2001 |
| JP | 2012244716 A | 12/2012 |
| JP | 2013230034 A | 11/2013 |
| JP | 2014030355 A | 2/2014 |
| JP | 6997105 B2 | 1/2022 |
| WO | 2010110951 A1 | 9/2010 |
| WO | 2016105505 A1 | 6/2016 |
| WO | 2016110833 A2 | 7/2016 |
| WO | 2017196571 A1 | 11/2017 |
| WO | 2017196572 A1 | 11/2017 |
| WO | 2017196649 A1 | 11/2017 |
| WO | 2018075726 A1 | 4/2018 |
| WO | 2018080604 A1 | 5/2018 |
| WO | 2018080614 A1 | 5/2018 |
| WO | 2018081619 A2 | 5/2018 |
| WO | 2018081619 A3 | 5/2018 |
| WO | 2018159914 A1 | 9/2018 |
| WO | 2019133110 A1 | 7/2019 |
| WO | 2020014158 A1 | 1/2020 |
| WO | 2020014161 A1 | 1/2020 |
| WO | PCT/US19/54102 | 2/2020 |
| WO | 2020072516 A1 | 4/2020 |
| WO | PCT/US19/67004 | 4/2020 |
| WO | 2020131977 A1 | 6/2020 |
| WO | PCT/US20/33421 | 9/2020 |
| WO | 2020236726 A1 | 11/2020 |
| WO | PCT/US21/14320 | 4/2021 |
| WO | 2021112870 A1 | 6/2021 |
| WO | 2021150684 A1 | 7/2021 |
| WO | 2021183172 A1 | 9/2021 |
| WO | PCT/US21/45624 | 11/2021 |
| WO | 2022031276 A1 | 2/2022 |
| WO | 2022036016 A1 | 2/2022 |

OTHER PUBLICATIONS

J.-E. Park et al., "Design on Topologies for High Efficiency Two-Stage AC-DC Converter," 2012 IEEE 7th International Power Electronics and Motion Control Conference—ECCE Asia, Jun. 2-5, 2012, China, 6 pages.

S. Cuk, "98% Efficient Single-Stage AC/DC Converter Topologies," Power Electronics Europe, Issue 4, 2011, 6 pages.

E. Carvou et al., "Electrical Arc Characterization for Ac-Arc Fault Applications," 2009 Proceedings of the 55th IEEE Holm Conference on Electrical Contacts, IEEE Explore Oct. 9, 2009, 6 pages.

C. Restrepo, "Arc Fault Detection and Discrimination Methods," 2007 Proceedings of the 53rd IEEE Holm Conference on Electrical Contacts, IEEE Explore Sep. 24, 2007, 8 pages.

K. Eguchi et al., "Design of a Charge-Pump Type AC-DC Converter for RF-ID Tags," 2006 International Symposium on Communications and Information Technologies, F4D-3, IEEE, 2006, 4 pages.

A. Ayari et al., "Active Power Measurement Comparison Between Analog and Digital Methods," International Conference on Electrical Engineering and Software Applications, 2013, 6 pages.

G. D. Gregory et al., "The Arc-Fault Circuit Interrupter, an Emerging Product," IEEE, 1998, 8 pages.

D. Irwin et al., "Exploiting Home Automation Protocols for Load Monitoring in Smart Buildings," BuildSys '11: Proceedings of the Third ACM Workshop on Embedded Sensing Systems for Energy-Efficiency in Buildings, Nov. 2011, 6 pages.

B. Mrazovac et al., "Towards Ubiquitous Smart Outlets for Safety and Energetic Efficiency of Home Electric Appliances," 2011 IEEE International Conference on Consumer Electronics, Berlin, German, Sep. 6-8, 2011, 5 pages.

L. Shengyuan et al., "Instantaneous Value Sampling AC-DC Converter and its Application in Power Quality Detection," 2011 Third

(56) References Cited

OTHER PUBLICATIONS

International Conference on Measuring Technology and Mechatronics Automation, Jan. 6-7, 2011, 4 pages.

H.-H. Chang et al., "Load Recognition for Different Loads with the Same Real Power and Reactive Power in a Non-intrusive Load-monitoring System," 2008 12th International Conference on Computer Supported Cooperative Work in Design, Apr. 16-18, 2008, 6 pages.

Darmayuda et al., "Ultra Fast Solid State Ground Fault Isolator," International Journal of Electronics and Communication Engineering, vol. 6, No. 9, Oct. 2012, pp. 902-905.

U.S. Appl. No. 63/356,317 filed in the name of Mark Telefus et al., filed Jun. 28, 2022, and entitled "FET-Based AC-to-DC Converter with Negative Cycle Gate Pre-Charge."

U.S. Appl. No. 63/402,058 filed in the name of Mark Telefus et al., filed Aug. 29, 2022, and entitled "Thermal-Mechanical Framework For Solid-State Circuit Breaker."

U.S. Appl. No. 63/436,344 filed in the name of Mark Telefus, filed Dec. 30, 2022, and entitled "Bidirectional Switch Device Implemented Using Bridge Rectifier."

U.S. Appl. No. 63/462,376 filed in the name of Mark Telefus, filed Apr. 27, 2023, and entitled "AC-to-DC Converter with Intelligent Capacitive Energy Storage Regulator."

U.S. Appl. No. 18/523,333 filed in the name of Mark Telefus et al., filed Nov. 29, 2023, and entitled "Ground Fault Detection in AC Systems Using Digital Signal Processing."

\* cited by examiner

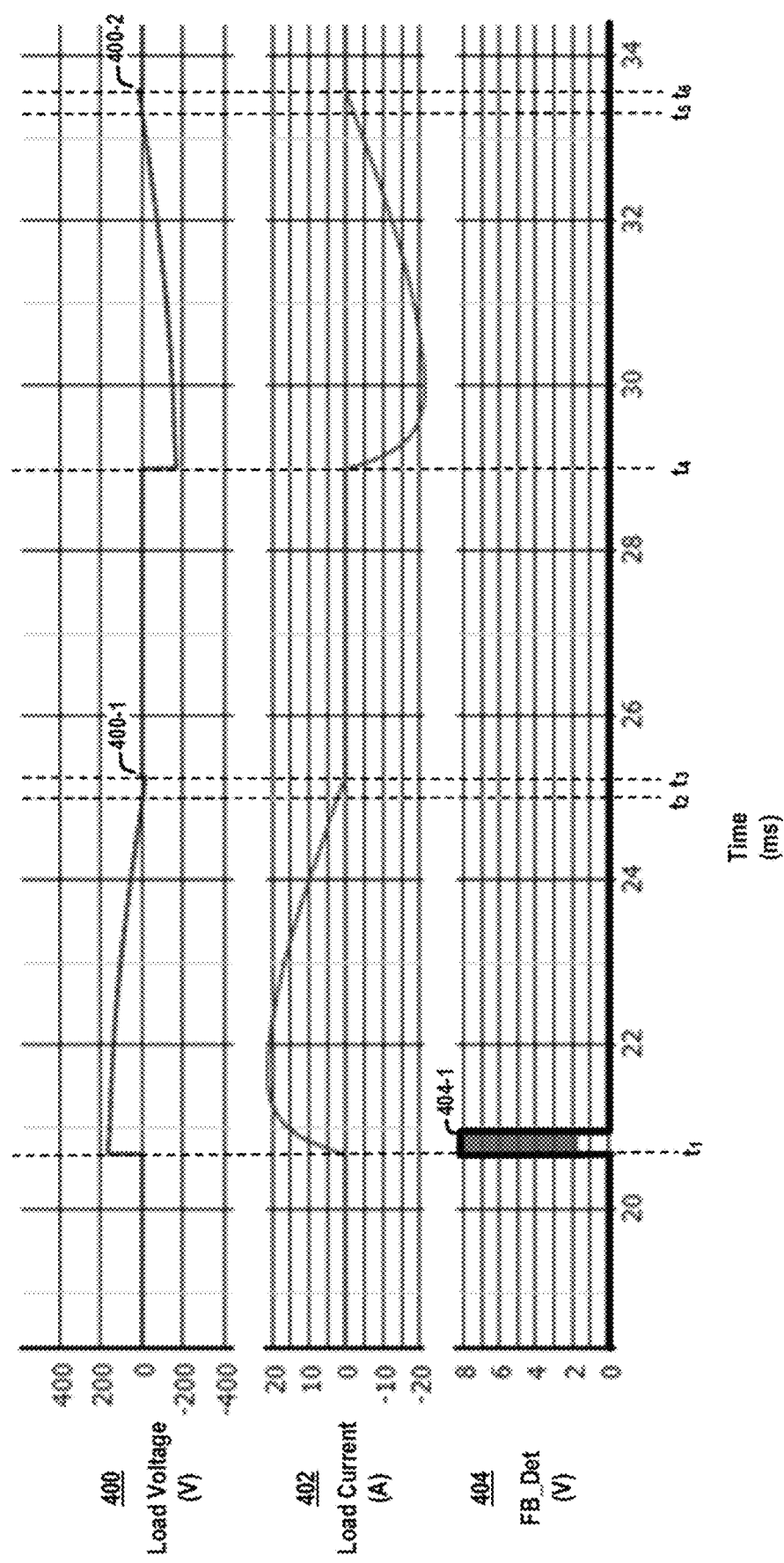

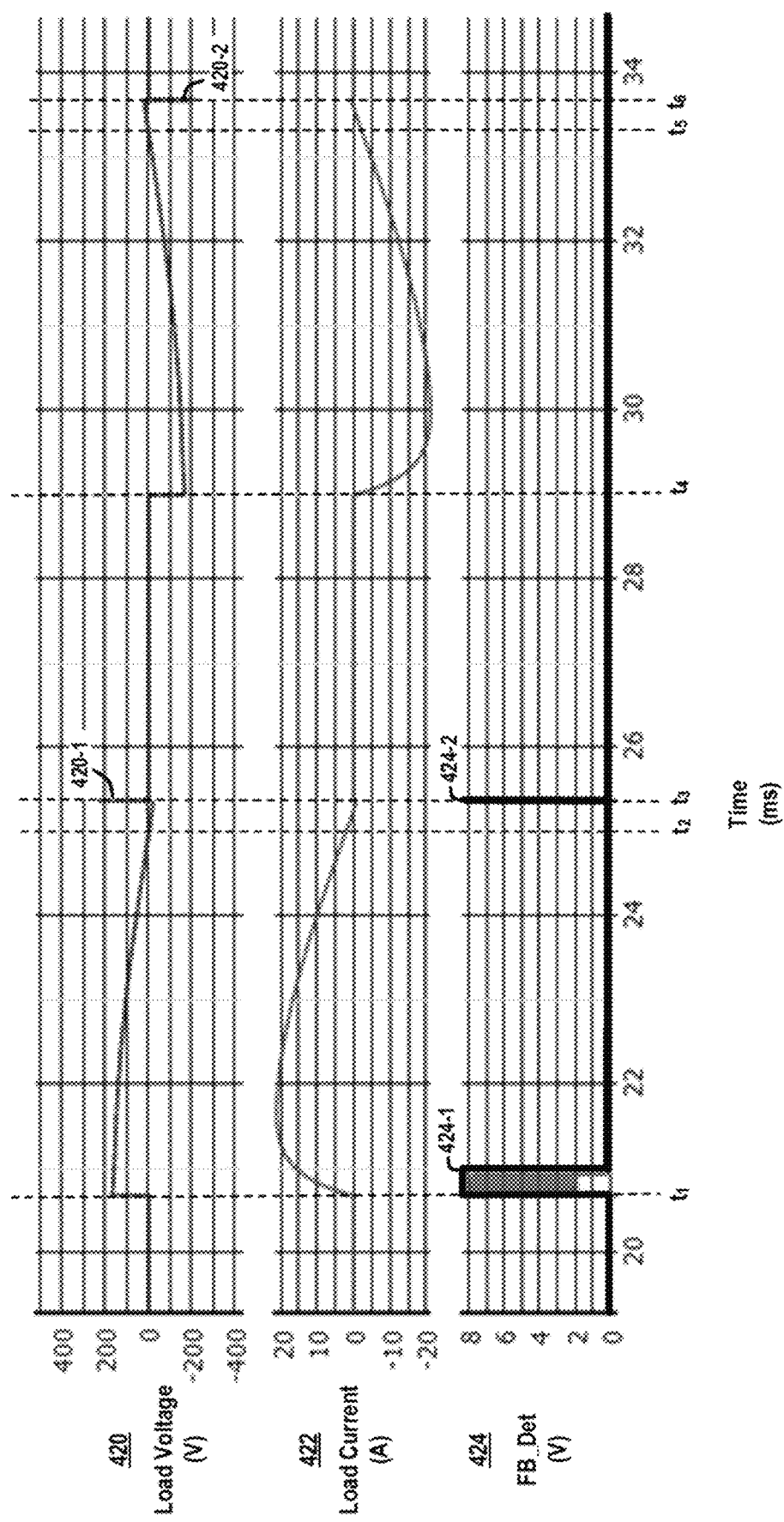

CONTROLLING AC POWER TO INDUCTIVE LOADS

CROSS-REFERENCE TO RELATED APPLICATION

This application claims the benefit of U.S. Provisional Application Ser. No. 63/303,492, filed on Jan. 26, 2022, the disclosure of which is incorporated herein by reference.

BACKGROUND

This disclosure relates generally to techniques for controlling alternating current (AC) power supplied to inductive loads to protect against inductive voltage spikes. Switching inductive loads such as motors, relays, solenoids, etc., can result in high magnitude voltage spikes due to back EMF (electromotive force), which is typically referred to as "inductive flyback voltage." More specifically, an inductive flyback voltage is a voltage spike created by, e.g., an inductive load when power to the inductive load is abruptly disconnected. The voltage spike is generated due to the fact that, e.g., an instantaneous termination of current flow through the inductive load results in the instantaneous creation of a large voltage spike across the inductive load, wherein the voltage amplitude is generated according to the equation: $V=Ldi/dt$. Such voltage spikes generated by an inductive load can be on the order of thousands of volts, which can damage an AC switch and circuitry which is utilized to supply AC power to the inductive load.

SUMMARY

Exemplary embodiments of the disclosure include devices and methods for controlling AC power that is supplied to inductive loads. In an exemplary embodiment, a device comprises a power input terminal configured for connection to an alternating current (AC) supply voltage, a load output terminal configured to connection to an inductive load, an AC switch, and a control system. The AC switch is connected in an electrical path between the power input terminal and the load output terminal, wherein the AC switch is configured to be placed into one of a turned-on state to couple the AC supply voltage to the inductive load, and a turned-off state to decouple the AC supply voltage from the inductive load. The control system is configured to (i) generate a switch control signal to place the AC switch into one of the turned-on state and the turned-off state, (ii) detect zero-voltage crossings of the AC supply voltage when connected to the power input terminal, (iii) monitor a load voltage of the inductive load when connected to the load output terminal to detect for a presence of inductive flyback voltage in the load voltage when the AC switch is placed into the turned-off state, and (iv) in response to detecting the presence of inductive flyback voltage in the load voltage, determine a delay time to place the AC switch into the turned-off state subsequent to a detected zero-voltage crossing of the AC supply voltage, so that the AC switch placed is placed into the turned-off state at a time which substantially coincides with a zero-current crossing of load current of the inductive load, to thereby suppress the generation of inductive flyback voltage when AC switch is placed into the turned-off state.

In another exemplary embodiment, an intelligent light dimmer device comprises a power input terminal configured for connection to an alternating current (AC) supply voltage, a load output terminal configured to connection to an inductive load comprising a magnetic low-voltage transformer which is configured to drive low voltage lighting, an AC switch, and a control system. The AC switch is connected in an electrical path between the power input terminal and the load output terminal, wherein the AC switch is configured to be placed into one of a turned-on state to couple the AC supply voltage to the inductive load, and a turned-off state to decouple the AC supply voltage from the inductive load. The control system is configured to (i) generate a switch modulation control signal to switch the AC switch between the turned-on state and the turned-off state to modulate an amount of AC power that is delivered to the inductive load based on a given dimming power level setting, (ii) detect zero-voltage crossings of the AC supply voltage when connected to the power input terminal, (iii) monitor a load voltage of the inductive load when connected to the load output terminal to detect for a presence of inductive flyback voltage in the load voltage when the AC switch is switched between the turned-on state and the turned-off state for the given dimming power level setting, and (iv) in response to detecting the presence of inductive flyback voltage in the load voltage, determine for the given dimming power level setting, a delay time to place the AC switch into the turned-off state subsequent to each detected zero-voltage crossing of the AC supply voltage, so that the AC switch is placed into the turned-off state at each time that substantially coincides with a zero-current crossing of load current of the inductive load, to thereby suppress the generation of inductive flyback voltage when the AC switch is switched between the turned-on state and the turned-off state for the given dimming power level setting.

Another exemplary embodiment includes a method which comprises: controlling AC power which is supplied to an inductive load by operation of an AC switch; detecting zero-voltage crossings of an AC voltage waveform of the AC power; generating a control signal to place a solid-state switch into a turned-off state; monitoring a load voltage of the inductive load to detect for a presence of inductive flyback voltage in the load voltage when the AC switch is placed into the turned-off state; and in response to detecting the presence of inductive flyback voltage in the load voltage, determine a delay time to place the AC switch into the turned-off state subsequent to a detected zero-voltage crossing of the AC voltage waveform, so that the AC switch placed into the turned-off state at a time which substantially coincides with a zero-current crossing of load current of the inductive load, to thereby suppress the generation of inductive flyback voltage when AC switch is placed into the turned-off state.

Other embodiments will be described in the following detailed description of exemplary embodiments, which is to be read in conjunction with the accompanying figures.

BRIEF DESCRIPTION OF THE DRAWINGS

FIGS. 4A, 4B, and 4C are simulated timing diagrams which illustrate a calibration process to calibrate a deactivation time of an AC switch which supplies AC power to an inductive load to protect against inductive flyback voltage, according to an exemplary embodiment of the disclosure.

DETAILED DESCRIPTION

Figure 1:
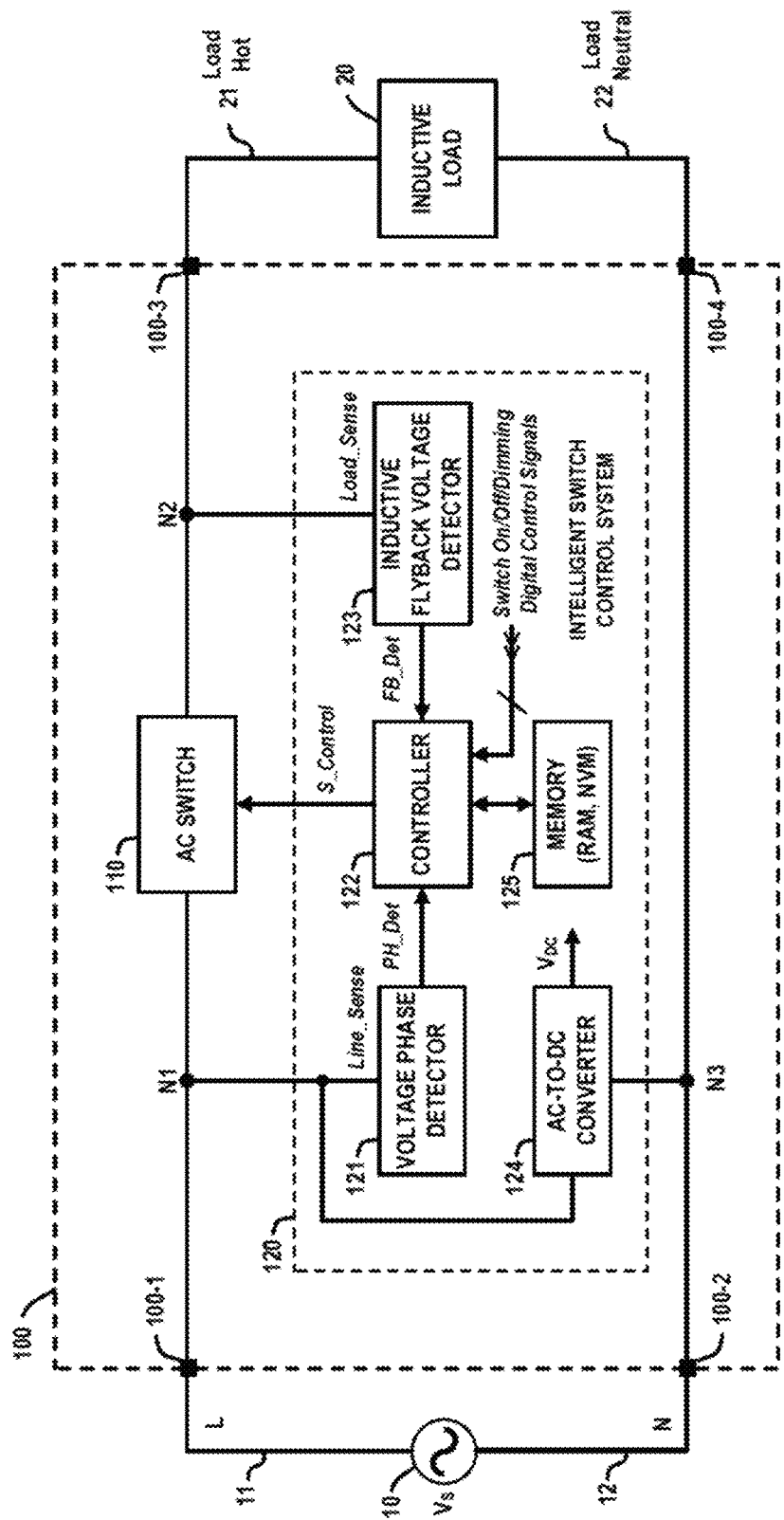
FIG. 1 schematically illustrates a device which is configured to control AC power supplied to an inductive load, according to an exemplary embodiment of the disclosure.

Embodiments of the disclosure will now be described in further detail with regard devices and methods for controlling AC power supplied to inductive loads and, in particular, techniques for controlling AC power supplied to inductive loads in a manner which protects AC switching devices (e.g., solid-state AC switch devices), which provide AC power to inductive loads, from inductive voltage spikes generated by such inductive loads. Exemplary embodiments of the disclosure include systems and methods for monitoring the load voltage of an inductive load to detect the presence of inductive flyback voltage, which may be generated in response to deactivation of an AC switch at a time that does not coincide with a zero-current crossing of a load current of the inductive load, and utilize timing information (such as the timing of zero-voltage crossings and the timing of the detected inductive flyback voltage) to determine or otherwise adjust an optimal time for delaying the termination of current (via deactivation of the AC switch) after the occurrence of a zero-voltage crossing of the AC power, so that such termination event occurs close enough in time to a zero-current crossing of the inductive load current to ensure that any inductive flyback voltage spike generated is relatively small in magnitude and non-destructive to, e.g., solid-state AC switch device.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) devices, field programmable gate array (FPGA) devices, etc.), processing devices (e.g., central processing unit (CPU) devices, graphical processing unit (GPU) devices, microcontroller devices, etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1 schematically illustrates a device which is configured to control AC power that is supplied to an inductive load, according to an exemplary embodiment of the disclosure. In particular, FIG. 1 schematically illustrates a device 100 which is configured to control AC power that is supplied from an AC power source 10 (e.g., AC mains) to an inductive load 20. The device 100 can be any type of intelligent electrical device which is configured to switchably connect/disconnect AC power to/from a load, e.g., inductive load. For example, in an exemplary embodiment, the device 100 comprises an intelligent switch device which is configured to supply AC power to a magnetic low-voltage transformer which is an example of the inductive load 20. The magnetic low-voltage transformer (inductive load) reduces, or steps down, a higher AC voltage to an AC voltage that is less than, e.g., 30 volts (V) (e.g., steps down 120 V to 12 V or 24 V) to drive low-voltage lighting. As explained in further detail below, the device 100 is configured to control the AC power supplied to the inductive load 20 in a manner that protects the components of the device 100 from inductive flyback voltage generated by the inductive load 20 when the device 100 disconnects AC power from the inductive load 20.

As schematically shown in FIG. 1, the device 100 comprises a first power input terminal 100-1, a second power input terminal 100-2, a first load terminal 100-3, a second load terminal 100-4, an AC switch 110, and an intelligent switch control system 120. The intelligent switch control system 120 comprises various components and circuitry such as a voltage phase detector 121, a controller 122, an inductive flyback voltage detector 123, an AC-to-DC converter 124, and one or more memory devices 125, the functions of which will be explained in further detail below. Depending on the type of device and given application (e.g., intelligent circuit breaker, intelligent electrical switch, etc.), the device 100 and intelligent switch control system 120 may comprise other types of mechanical and/or electrical components to perform specific functions that are associated with a given application. While FIG. 1 illustrates an exemplary configuration in which the various components 121, 122, 123, 124, and 125 of the intelligent switch control system 120 are shown as separate components, in some embodiments, some or all of such components can be packaged together to implement a system-on-a-chip (SoC) or system or as a system-in-package (SIP) device which integrates multiple functional chips in a package.

In some embodiments, the AC power source 10 comprises a utility power source (e.g., AC mains) which provides an AC supply voltage waveform Vs with a frequency of 60 Hz and a voltage of 120 VRMS (a peak value of about 170V), wherein the AC supply voltage waveform with a frequency of 60 Hz has a period of about 16.66 milliseconds, wherein each positive half-cycle (or positive phase) and negative half-cycle (or negative phase) of the 60 Hz supply voltage waveform has a duration of about 8.33 milliseconds. In other embodiments, the AC power source 10 can be other sources of AC power at different voltage levels and/or frequencies. In the exemplary embodiment of FIG. 1, the AC power source 10 is coupled to a hot (L) line 11 (e.g., a hot phase of the AC mains), and a neutral (N) line 12 (e.g., a neutral phase of the AC mains). The first and second power input terminals 100-1 and 100-2 are configured to connect the device 100 to the respective hot and neutral lines 11 and 12. The first and second load terminals 100-3 and 100-4 are configured to connect the device 100 to a load hot line 21 and a load neutral line 22, respectively, of a branch circuit comprising the inductive load 20.

As schematically illustrated in FIG. 1, the AC switch 110 is connected between a first node N1 (alternatively, line hot node or line sense node) and a second node N2 (alternatively, load hot node or load sense node) in an electrical path between the first power input terminal 100-1 and the first load terminal 100-3. In some embodiments, the AC switch 110 comprises a bidirectional solid-state switch device which comprises two serially connected solid-state switches in a common source or common drain configuration, an exemplary embodiment of which will be explained in further detail below in conjunction with FIG. 2. The AC switch 110 is controlled by a switch control signal (denoted S_Control) which is generated by the controller 122, wherein the switch control signal S_Control causes the AC switch 110 to be placed in one of (i) a switched-on state (or activated state) to connect AC power to the inductive load 20 and (ii) a switched-off state (or deactivated state) to disconnect AC power from the inductive load 20.

In some embodiments, the controller 122 is implemented using at least one intelligent, programmable hardware processing device such as a microprocessor, a microcontroller, an ASIC, an FPGA, a CPU, etc., which is configured to execute software routines to intelligently control the operation of the AC switch 110 to perform various functions. In some embodiments, the one or more memory devices 125 comprise volatile random-access memory (RAM) and non-volatile memory (NVM), such as Flash memory, to store calibration data, operational data, and executable code for performing various intelligent operations as discussed herein, etc. For example, in some embodiments where the device 100 comprises an intelligent electrical switch with dimming capability, the controller 122 executes a PWM (pulse width modulation) process to generate a pulse width modulated switch control signal S_Control to modulate the turn-on time of the AC switch 110 during the positive and negative half cycles of the input AC power to thereby modulate the amount of AC power supplied to the inductive load 20. Furthermore, as explained in further detail below, the controller 122 executes intelligent algorithms to determine an appropriate time to control the switching of the AC switch 110 to limit a magnitude of inductive flyback voltage that is generated by the inductive load 20 when the AC switch is deactivated and the AC power source 10 is disconnected from the inductive load.

As illustrated in FIG. 1, in some embodiments, the controller 122 receives digital control signals, e.g., switch On, switch Off, and switch dimming level control signals, which are generated as a result of a user manipulating a physical control element such as a switch On/Off control element and/or a dimming control element of the device 100. For example, a dimmer control element of the device 100 allows a user to adjust a dimming level for, e.g., lighting. The dimmer control element can be implemented using known dimmer control mechanisms. For example, the dimmer control element of the device 100 can be a slider control element, a touch pad control element, etc. In other embodiments, the dimmer control element can be implemented using an electronic potentiometer. The intelligent switch control system 120 comprises a dimmer interface (e.g., hardware interface) which is configured to convert dimmer adjustment control signals from the dimmer control element into digital signals that are input to the controller 122 and processed to implement dimming functions.

Further, a switch On/Off control element of the device 100 is configured to allow a user to turn power on and off to the load, e.g., lighting. The switch On/Off control element can be implemented using known switch control mechanisms. For example, the switch On/Off control element of the device 100 can be a mechanical toggle element, a slider control element, a touch pad control element, etc. The intelligent switch control system 120 comprises a switch interface (e.g., hardware interface) which is configured to convert switch On/Off control signals from the switch On/Off control element into digital signals that are input to the controller 122 and processed to implement On/Off switching functions.

As noted above, the controller 122 executes an intelligent algorithm to determine an appropriate time to control the switching of the AC switch 110 to limit a magnitude of inductive flyback voltage that is generated by the inductive load 20 when the AC switch is deactivated and the AC power source 10 is disconnected from the inductive load 20. In some embodiments, the controller 122 utilizes detection signals (denoted PH_Det and FB_Det), which are generated and output from the voltage phase detector 121 and the inductive flyback voltage detector 123, respectively, to determine and control the timing at which the AC switch 110 is deactivated following a zero-voltage crossing of the AC supply voltage waveform at the line sense node N1. The time at which the controller 122 deactivates the AC switch 110 (subsequent to a detected zero-voltage crossing of the AC supply voltage waveform on the line sense node N1) is determined by the controller 122 to be the same time, or substantially the same time, as a zero-current crossing of the load current. Deactivating the AC switch 110 at the same time, or substantially the same time, as the zero-current crossing of the load current, serves to eliminate inductive flyback voltage from being generated, or otherwise significantly suppresses the magnitude of inductive flyback voltage that is generated, and thereby protect the AC switch 110 from damage due as a result of a relatively high magnitude inductive flyback voltage. As explained in further detail below, in some embodiments, the controller 122 executes a calibration process to determine a switch turn-off time subsequent to a zero-voltage crossing of the AC supply voltage waveform for a plurality of dimming power levels at various increments (e.g., 2.5% increments) from 0% to 100%. The calibration process generates calibration data that is specific to the given inductive load 20 coupled to the device 100.

In some embodiments, the voltage phase detector 121 is configured to sense the voltage (Line Sense) at a target point (e.g., line sense node N1) along the electrical path between the first power input terminal 100-1 and the first load output terminal 100-3 of the device 100 and detect zero-voltage crossings of an AC supply voltage waveform. For example, as shown in FIG. 1, the voltage phase detector 121 is coupled to the line sense node N1 of the electrical path upstream (line side) of the AC switch 110 to detect instances of zero-voltage crossings of the AC power waveform on the line side of the AC switch 110. The voltage phase detector 121 generates phase detection signals PH_Det which indicate zero-voltage crossings of the AC supply voltage waveform and associated transition directions of the detected zero-voltage crossings of the AC supply voltage waveform, e.g., the AC supply voltage waveform transitioning from a negative phase to a positive phase (referred to as "positive transition direction"), or the AC supply voltage waveform transitioning from positive phase to a negative phase (referred to as a "negative transition direction").

The controller 122 utilizes the phase detection signals PH_Det to determine timing information of the zero-voltage crossings of the AC supply voltage waveform, wherein such timing information is utilized in conjunction with a priori knowledge of the period/frequency of the AC supply voltage waveform to determine the appropriate timing for activating/deactivating the AC switch 110 (by generating and applying an appropriate modulated switch control signal S_Control to the AC switch 110) to modulate the amount of power that is supplied to the inductive load 20 in the positive and negative phases of the AC supply voltage waveform to thereby obtain a target dimming power level. For example, as noted above, when the AC supply voltage waveform is known to have a frequency of 60 Hz and a period of about 16.66 milliseconds, the controller 122 will know that each positive and negative half-cycle of the 60 Hz AC supply voltage waveform has a duration of about 8.33 milliseconds following the detection time of each zero-voltage crossing of the AC supply voltage waveform.

The voltage phase detector 121 can be implemented using any suitable type of zero-voltage crossing detection circuitry that is configured to sense zero-voltage crossings of the AC supply voltage waveform and generate a detection signal which indicates a zero-voltage crossing event and an associated transition direction of the zero-voltage crossing event of the AC supply voltage waveform. For example, in some embodiments, the voltage phase detector 121 implements zero-voltage crossing detection circuitry which is configured to compare the input AC supply voltage waveform to a zero reference voltage (e.g., line neutral voltage), and detect the transitions of the AC supply voltage waveform between the positive and negative phases, which coincide when the AC supply voltage waveform crosses the zero reference voltage. In some embodiments, the zero-voltage crossing detector circuitry is configured to generate a square wave output which transitions between a logic "1" and logic "0" output upon each zero-voltage crossing of the AC supply voltage waveform. In other embodiments, the zero-voltage crossing detector circuitry is configured to generate a short-lived pulse (~3 us) having an RC-adjustable duration.

More specifically, in some embodiments, the zero-voltage crossing detection circuitry is configured to receive as input a sampling of the AC supply voltage waveform at the line sense node N1 (on the line side of the AC switch 110), compare the AC waveform sample to a zero reference voltage (e.g., line neutral voltage) to determine the polarity of the AC supply voltage waveform at the line sense node N1, and detect a zero-voltage crossing event and the associated transition direction of the zero-voltage crossing of the AC supply voltage waveform. In some embodiments, the comparing is performed using a voltage comparator which has a non-inverting input connected to the line sense node N1, and an inverting input that receives a reference voltage. The output of the voltage comparator switches (i) from logic 1 to logic 0 when the input voltage transitions from positive to negative and (ii) from logic 0 to logic 1 when the input voltage transitions from negative to positive. In this instance, the output of the zero-voltage crossing detection circuitry will transition between a logic "1" and logic "0" output upon each detected zero-voltage crossing of the AC supply voltage waveform.

As schematically illustrated in FIG. 1, the inductive flyback voltage detector 123 has an input terminal that is coupled to the load sense node N2 and is configured to monitor the load voltage to detect for the presence of inductive flyback voltage that may be generated at the load sense node N2 when the AC switch 110 is deactivated. In some embodiments, the inductive flyback voltage detector 123 is configured to generate a flyback detection signal FB_Det (e.g., FB_Det pulse) when a magnitude of the sensed inductive flyback voltage exceeds a flyback voltage threshold (e.g., 30 V). Furthermore, in some embodiments, the inductive flyback voltage detector 123 is configured to generate a flyback detection signal FB_Det in either a positive phase or negative phase of the AC supply voltage waveform to provide an indication of whether the turn-off time of the AC switch 110 occurs before the zero-current crossing or after the zero-current crossing of the load current.

For example, in some embodiments, when the AC supply voltage waveform transitions from a positive phase to a negative phase and the AC switch 110 is turned off at some time after the zero-voltage crossing of the transition from the positive phase to the negative phase, the generation of a flyback detection signal FB_Det provides an indication to the controller 122 that the AC switch 110 was turned off too late (i.e., after the time of the zero-current crossing of the load current), resulting in unwanted inductive flyback voltage. On the other hand, when the AC supply voltage waveform transitions from a negative phase to a positive phase and the AC switch 110 is turned off at some time after the zero-voltage crossing of the transition from the negative phase to the positive phase, the generation of a flyback detection signal FB_Det provides an indication to the controller 122 that the AC switch 110 was turned off too soon (i.e., before the time of the zero-current crossing of the load current), resulting in unwanted inductive flyback voltage. In this regard, since the controller 122 has knowledge of the phase of the AC supply voltage waveform based on the phase detection signals PH_Det provided by the voltage phase detector 121, the controller 122 can determine whether to increase or decrease the delay time to deactivate the AC switch 110 following the time of a zero-voltage crossing, depending on whether the flyback detection signal FB_Det was generated after the transition from a positive phase or after the transition from a negative phase. The controller 122 executes a calibration process to adjust the time delay for deactivating the AC switch 110 following a zero-voltage crossing of the AC supply voltage waveform to thereby ensure that the AC switch 110 is deactivated at time which coincides with the time (e.g., which is at or substantially near) of the zero-current crossing of the load current, to thereby eliminate or substantially suppress the magnitude of inductive flyback voltage. An exemplary embodiment of the inductive flyback voltage detector 123 and associated functions will be described in further detail below in conjunction with, e.g., FIGS. 3, 4A, 4B, and 4C.

The AC-to-DC converter 124 is configured to generate a DC power supply voltage ($V_{DC}$) to provide DC power for operating the various components of the intelligent switch control system 120. As schematically illustrated in FIG. 1, the AC-to-DC converter 124 has inputs that are coupled to the line hot node N1 and a third node N3 (or line neutral node N3) to receive as input the AC supply voltage Vs that is applied to the first and second power input terminals 100-1 and 100-2 of the device 100. The AC-to-DC converter 124 is configured to convert the AC supply power which is applied across the nodes N1 and N3, to a regulated DC supply voltage $V_{DC}$. The regulated DC supply voltage $V_{DC}$ is utilized to provide DC power to operate the various system components 121, 122, 123 and 125. The AC-to-DC converter 124 can be implemented using any AC-to-DC circuitry which is suitable for the given application.

Figure 2:
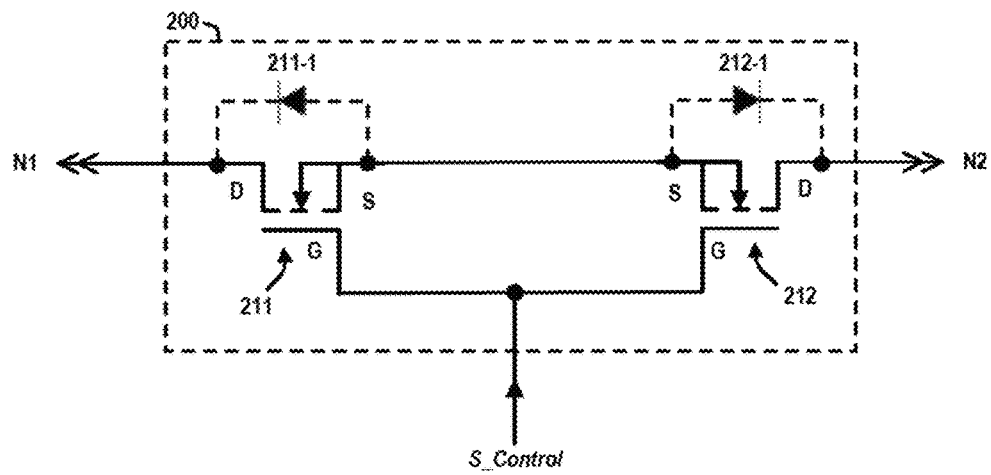
FIG. 2 schematically illustrates a bidirectional solid-state switch which can be implemented in the device of FIG. 1, according to an exemplary embodiment of the disclosure.

In some embodiments, as noted above, the AC switch 110 is implemented using a bidirectional solid-state switch. For example, FIG. 2 schematically illustrates a bidirectional solid-state switch 200 which can be utilized to implement the AC switch 110 of the device of FIG. 1, according to an exemplary embodiment of the disclosure. As shown in FIG. 2, the bidirectional solid-state switch 200 comprises a first solid-state switch 211 and a second solid-state switch 212. In some embodiments, the first and second solid-state switches 211 and 212 each comprise a metal-oxide-semiconductor field-effect transistor (MOSFET) device and, in particular, high-power MOSFET switches. In some embodiments, the first and second solid-state switches 211 and 212 comprise N-type enhancement MOSFET devices. The first and second solid-state switches 211 and 212 are serially connected back-to-back with commonly connected source(S) terminals, as well as commonly connected gate (G) terminals that are coupled to an output port of the controller 122 of FIG. 1 to receive a switch control signal S_Control.

The first solid-state switch 211 comprises a drain terminal which is coupled to the line sense node N1, and the second solid-state switch 212 comprises a drain terminal which is coupled to a load sense node N2. As further shown in FIG. 2, the first and second solid-state switches 211 and 212 comprise intrinsic body diodes 211-1 and 212-1, respectively, where each body diode represents a P-N junction between a P-type substrate body to an N-doped drain region of the MOSFET switch. The body diodes 211-1 and 212-1 are intrinsic elements of the first and second solid-state switches 211 and 212 (i.e., not discrete elements) and, thus, are shown with dashed-line connections. It is to be noted that the intrinsic body-to-source diodes of the first and second solid-state switches 211 and 212 are not shown as they are shorted out by the connections between the source regions and the substrate bodies (e.g., N+ source and P-doped body junction are shorted through source metallization). The bidirectional solid-state switch 200 is configured to (i) allow the bidirectional flow of load current between, e.g., the first power input terminal 100-1 and the first load terminal 100-3 of the device 100 of FIG. 1, when the bidirectional solid-state switch 200 is in a switched-on state and (ii) block the bidirectional flow of load current between first power input terminal 100-1 and the first load terminal 100-3 of the device 100 when the bidirectional solid-state switch 200 is in switched-off state.

Figure 3:
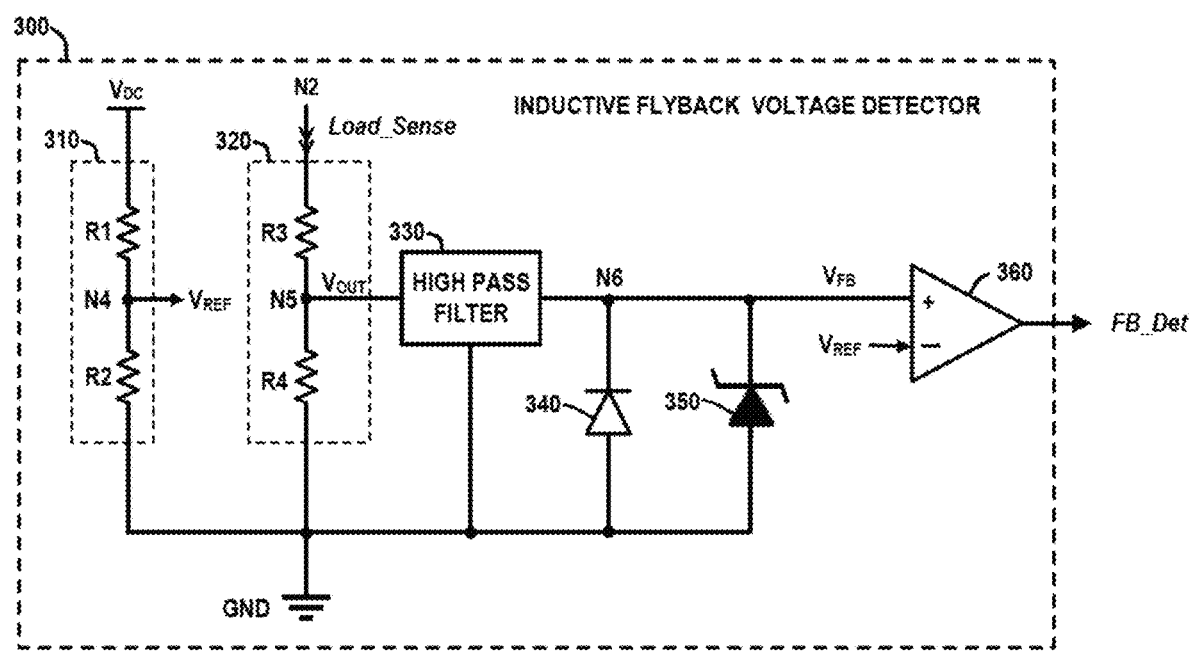
FIG. 3 schematically illustrates an inductive flyback voltage detector, according to an exemplary embodiment of the disclosure.

FIG. 3 schematically illustrates an inductive flyback voltage detector 300, according to an exemplary embodiment of the disclosure. In some embodiments, the inductive flyback voltage detector 123 of FIG. 1 is implemented using the circuit architecture of the inductive flyback voltage detector 300 of FIG. 3. The inductive flyback voltage detector 300 comprises a first voltage divider 310, a second voltage divider 320, a high pass filter circuit 330, a diode 340, a Zener diode 350, and a comparator 360. The inductive flyback voltage detector 300 is configured to sense the load voltage at the load sense node N2 (FIG. 2) to detect for an occurrence of an inductive flyback voltage spike, and then generate a flyback detection pulse FB_Det if the magnitude of the detected inductive flyback voltage spike is greater than a flyback threshold voltage. In an exemplary non-limiting embodiment, the flyback threshold voltage is about 30 V or less depending on the application.

The first voltage divider 310 comprises a first resistor R1 and a second resistor R2 serially connected between a DC supply voltage node ($V_{DC}$) and a ground node (GND). In some embodiments, the DC supply voltage node is coupled to an output of the AC-to-DC converter 124 (FIG. 1) to receive the DC supply voltage $V_{DC}$ that is generated by the AC-to-DC converter 124. The first voltage divider 310 generates a reference voltage $V_{REF}$ on an output node N4 of the first voltage divider 310. In an exemplary non-limiting embodiment, the DC supply voltage $V_{DC}$ is 3.3V and the first and second resistors R1 and R2 have resistance values that are selected to provide a target division ratio to generate a reference voltage $V_{REF}$ with a magnitude that is about 1/11 $V_{DC}$.

The second voltage divider 320 comprises a third resistor R3 and a fourth resistor R4 serially connected between the load sense node N2 and the GND node. The second voltage divider 320 is configured to generate an output voltage $V_{OUT}$ on node N5, which has a smaller voltage magnitude than the magnitude of the sensed load voltage that is input from the load sense node N2. The output voltage $V_{OUT}$ from the second voltage divider 320 is input to the high pass filter 330.

The high pass filter 330 is configured to filter the output voltage $V_{OUT}$ to remove low frequency components (e.g., 60 Hz frequency component) and pass high-frequency signal components that correspond to an inductive flyback voltage present in the load voltage on the load sense node N2, and output a filtered voltage signal on node N6. The filtered voltage signal corresponds to a flyback voltage (denoted $V_{FB}$) present in the load voltage on the load sense node N2. In some embodiments, the high pass filter 330 comprises a passive RC filter circuit which comprise a capacitor having a first terminal coupled to node N5 and a second terminal coupled to a node N6, and a resistor connected to and between the second terminal of the capacitor and the ground node GND. The RC high pass filter comprises a cutoff frequency fc that is configured according to the formula fc=$1/(2\pi RC)$, where R denotes a resistance of the resistor and C denotes a capacitance of the capacitor, as is known in the art.

As further shown in FIG. 3, the diode 340 comprises a cathode terminal coupled to the node N6 and an anode terminal coupled to the ground node GND. Similarly, the Zener diode 350 comprises a cathode terminal coupled to the node N6, and an anode terminal coupled to the ground node GND. The comparator 360 comprises a non-inverting (+) input terminal which is coupled to the node N6, an inverting (−) input terminal which is coupled to the output node N4 of the first voltage divider 310 to receive as input the reference voltage $V_{REF}$, and an output terminal which outputs a flyback voltage detection signal FB_Det. The comparator 360 is configured to compare the voltage $V_{FB}$ on the node N6 with the reference voltage $V_{REF}$, and output a digital signal as a logic "1" or logic "0" depending on which input voltage is greater.

In particular, when the magnitude of $V_{FB}$ is greater than $V_{REF}$, the comparator 360 outputs a logic "1" pulse as the flyback voltage detection signal FB_Det, which indicates the presence of an inductive flyback voltage that exceeds the flyback voltage threshold. On the other hand, when the magnitude of $V_{FB}$ is less than $V_{REF}$, the comparator 360 outputs a logic "0" voltage, which indicates that (i) no inductive flyback voltage is present in the load voltage on the load sense node N2 or that (ii) the magnitude of the inductive flyback voltage, if present, is less than the flyback voltage threshold. In some embodiments, the voltage division ratios of the first and second voltage dividers 310 and 320 are configured such that the reference voltage $V_{REF}$ corresponds to the flyback voltage threshold (e.g., 30 V), and the magnitude of the filtered voltage $V_{FB}$ has a magnitude that is reduced in proportion to the reference voltage $V_{REF}$.

In an exemplary embodiment, the diode 340 is configured to shunt the node N6 to the ground node GND when the filtered inductive flyback voltage $V_{FB}$ output from the high pass filter 330 has a negative magnitude (e.g., negative inductive flyback voltage pulse/spike). In the exemplary device 100 of FIG. 1, a negative inductive flyback voltage spike may be generated when the AC switch 110 is turned off at some time following the transition from a positive phase to a negative phase of the input AC supply voltage waveform, if the AC switch 110 is turned off at time which does not correspond to the time of the zero-current crossing of the load current. As such, the sensed load voltage that is input to the inductive flyback voltage detector 300 from the load sense node N2 will have a negative inductive voltage spike. In this instance, the filtered inductive flyback voltage $V_{FB}$ output from the high pass filter 330 will have a negative magnitude, which causes the diode 340 to turn on and shunt the filtered inductive flyback voltage $V_{FB}$ to ground GND. This prevents a negative voltage from being applied to the non-inverting (+) input terminal of the comparator 360, which serves no purpose as the comparator 360 would not generate a flyback detection pulse FB_Det in response to a negative inductive flyback voltage spike.

The Zener diode 350 is utilized to limit the maximum magnitude of $V_{FB}$ on the node N6 by a Zener voltage (i.e., reverse breakdown voltage) of the Zener diode 350. In this regard, when the positive magnitude of $V_{FB}$ on the node N6 exceeds the Zener voltage of the Zener diode 350, the Zener diode 350 operates in reverse-biased mode and regulates the maximum voltage on node N6 to the Zener voltage. In an exemplary embodiment, the Zener diode 350 has a Zener voltage of 2.4 V.

As noted above, the controller 122 of the device 100 of FIG. 1 is configured to monitor the output signal FB_Det of the inductive flyback voltage detector 123 (or the inductive flyback voltage detector 300) to detect the occurrence of inductive flyback voltage and determine if the detected inductive flyback voltage is caused by terminating conduction too early or too late (i.e., turning off the AC switch 110) in relation to a current zero-current crossing of the load current. In some embodiments, such monitoring is performed by the controller 122 during an automated calibration process which is executed by the controller 122 to determine an appropriate deactivation time for the AC switch 110 (subsequent to a zero-voltage crossing event) for each dimming power level setting of a plurality of dimming power level settings at various increments (e.g., 2.5% increments) in a range from 0% to 100%. An exemplary calibration process will now be discussed in detail with initial reference to FIGS. 4A-4C.

Figure 4B:
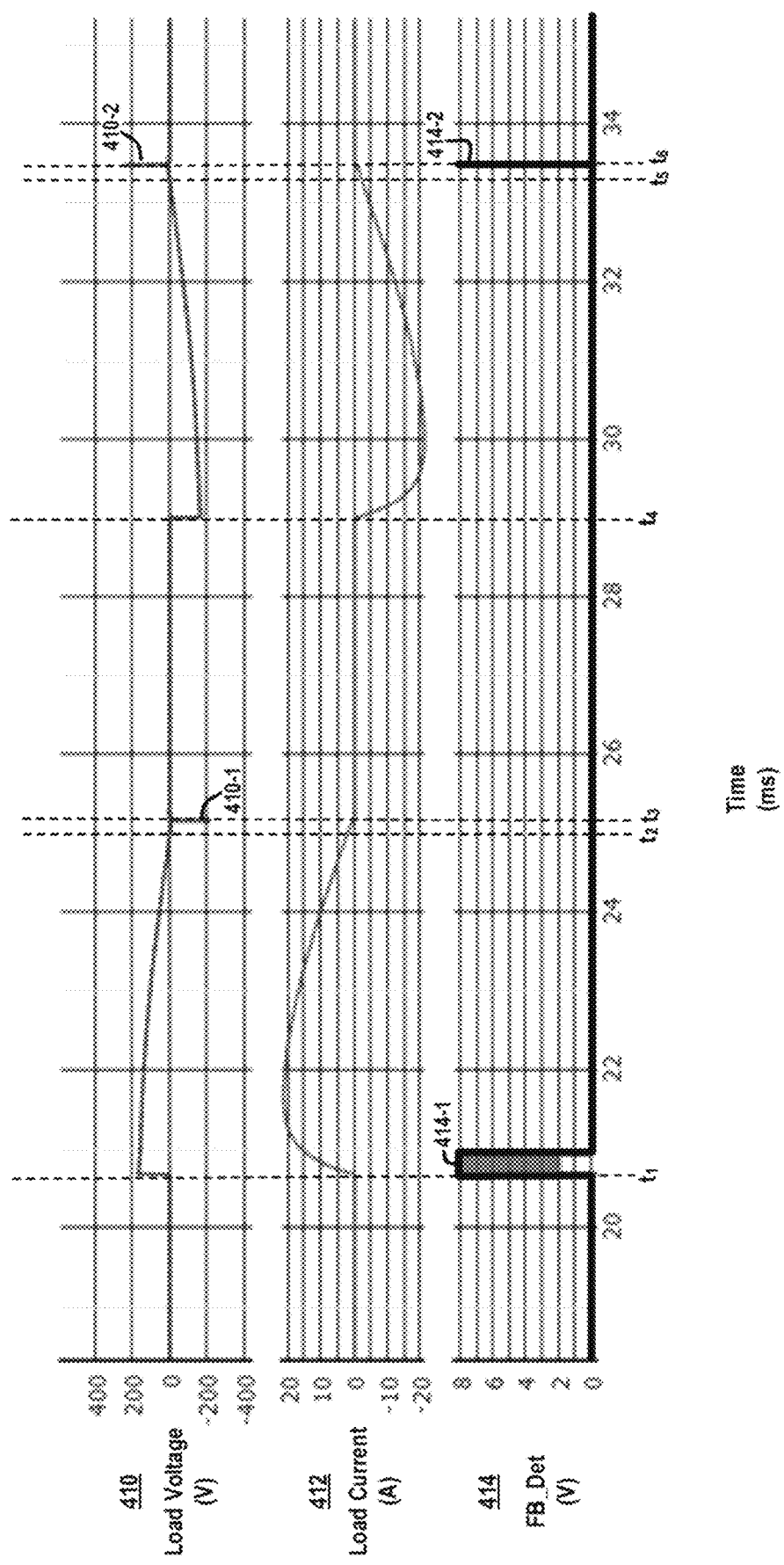

FIGS. 4A, 4B, and 4C are simulated timing diagrams which illustrate a calibration process to calibrate a deactivation time of an AC switch which supplies AC power to an inductive load to protect against inductive flyback voltage, according to an exemplary embodiment of the disclosure. More specifically, FIGS. 4A, 4B, and 4C are timing diagrams which illustrate simulated waveforms of a load voltage in volts (V), a load current in amperes (A), and a flyback detection signal (FB_Det) in volts (V) which is generated by an inductive flyback voltage detector, which are generated for different detection events that occur for a same dimming power level setting. For purposes of illustration, the exemplary timing diagrams will be discussed in the context of the exemplary embodiments shown in FIGS. 1 and 3. For each of the simulated timing diagrams shown in FIGS. 4A, 4B, and 4C, it is assumed that the AC supply voltage waveform has a frequency of 60 Hz (a period of about 16.66 milliseconds) and a voltage of 120V RMS (with peak voltages of about +170 and −170 V), and that the calibration process is at a point where the controller 122 is operating to determine an appropriate deactivation time of the AC switch 110 at a dimming power level setting of 50%, wherein it is assumed that the load current lags the load voltage by 275 microseconds (μs). Each of the simulated timing diagrams show waveforms/signals that are generated over a time scale in milliseconds (ms).

In particular, FIG. 4A depicts simulated timing diagrams of an exemplary load voltage waveform 400, a load current waveform 402, and a flyback detection signal (FB_Det) 404, which are generated as a result of achieving a desired target state of calibration for a dimming power level setting of 50% in which the load current is terminated (via deactivation of the AC switch 110) at substantially the same time as the zero-current crossing of the load current, in which case no inductive flyback voltage is detected. In an exemplary embodiment, for a 50% dimming power level setting, it is assumed that the AC switch 110 is activated for at least one-half (50%) of the duration of each positive half-cycle and negative half-cycle of the AC supply voltage waveform. FIG. 4A illustrates various points in time $t_1$, $t_2$, $t_3$, $t_4$, $t_5$, and $t_6$ that denote certain events.

For example, at time $t_1$ (e.g., 20.6 ms), it is assumed that the AC switch 110 is activated (turned on), which causes the exemplary load voltage waveform 400 to abruptly increase from 0V to a peak voltage of 170V, and which causes the load current waveform 402 to increase. In this exemplary embodiment, for a 50% dimming power level, the controller 122 activates the AC switch 110 at the mid-point of each positive half-cycle of the AC supply voltage waveform (as well as at the mid-point of each negative half-cycle of the AC supply voltage waveform). Furthermore, at time $t_1$, the FB_Det signal 404 includes a logic "1" pulse 404-1 (e.g., 8V pulse) that is generated by the inductive flyback voltage detector. The pulse 404-1 in the FB_Det signal 404 is generated as a result of the high-frequency components of the load voltage waveform, which result from the abrupt transition of the load voltage waveform 400 from 0 V to 170 V when the AC switch 110 is turned on. Since these high-frequency components are not blocked by the high pass filter 330 (FIG. 3), the pulse 404-1 in the FB_Det signal 404 will be generated in each positive half-cycle at the moment the AC switch 110 is turned on. The FB_Det pulse 404-1 is essentially a false positive flyback detection signal, which is ignored by the controller 122.

Next, time $t_2$ represents the time of a zero-voltage crossing of the load voltage waveform 400 (i.e., when the load voltage is 0 V). As shown in FIG. 4A, at time $t_2$, the load current waveform 402 is greater than 0 A (e.g., about +5 A), due to the fact that the load current lags the load voltage for the inductive load. Next, at time $t_3$, the AC switch 110 is turned off (which interrupts the load current). In this instance, as noted above, it is assumed that the AC switch 110 is turned off at substantially the same time as the zero-current crossing of the load current waveform 402 (i.e., when the load current is substantially 0 A). In the exemplary embodiment, it is assumed that time $t_3$ is 275 microseconds after the time $t_2$ of the occurrence of the zero-voltage crossing of the load voltage waveform 400. In this instance, a very small inductive flyback voltage 400-1 is generated at time $t_3$. Since the magnitude of the inductive flyback voltage 400-1 is below the flyback voltage threshold, the inductive flyback voltage detector will not generate a FB_Det pulse at time $t_3$. In this instance, at time $t_3$, the FB_Det signal 404 remains at a logic "0" level (e.g., 0V).

As further shown in FIG. 4A, at time $t_4$, it is assumed that the AC switch 110 is activated (turned on), which causes the exemplary load voltage waveform 400 to abruptly transition from 0 V to a negative peak voltage of −170 V, and which causes the load current waveform 402 to negatively increase. As noted above, for a 50% dimming power level setting, the controller 122 activates the AC switch 110 at the mid-point of each positive and negative half-cycle of the AC supply voltage waveform. It is to be noted that at time $t_4$, a false positive FB_Det pulse is not generated in the flyback detection signal 404, because the high-frequency components of the load voltage waveform, which result from the abrupt transition of the load voltage waveform 400 from 0 V to −170 V when the AC switch 110 is turned on, results in a negative filtered output voltage $V_{FB}$ being output from the high pass filter 330. The negative $V_{FB}$ voltage at the output of the high pass filter 330 causes the diode 340 to turn on and shunt the negative $V_{FB}$ voltage to the ground node GND. As such, no false positive FB_Det pulse is generated in the negative half-cycle when the AC switch 110 is turned on.

Next, time $t_5$ represents the time of a zero-voltage crossing of the load voltage waveform 400 (i.e., when the load voltage is 0 V). As shown in FIG. 4A, at time $t_5$, the load current waveform 402 is less than 0 A (e.g., about −5 A), due to the fact that the load current lags the load voltage for the inductive load. Next, at time $t_6$, the AC switch 110 is turned off (which terminates the load current). In this instance, as noted above, it is assumed that the AC switch 110 is turned off at substantially the same time as the zero-current crossing of the load current waveform 402 (i.e., when the load current is substantially 0 A). In the exemplary embodiment, it is assumed that time $t_6$ is 275 microseconds after the time $t_5$ of the occurrence of the zero-voltage crossing of the load voltage waveform 400. In this instance, a very small inductive flyback voltage 400-2 is generated at time $t_6$. Since the magnitude of the inductive flyback voltage 400-2 is below the flyback voltage threshold, the inductive flyback voltage detector will not generate a FB_Det pulse at time $t_6$. In this instance, at time $t_6$, the FB_Det signal 404 remains at a logic "0" level (e.g., 0V).

Next, FIG. 4B depicts simulated timing diagrams of an exemplary load voltage waveform 410, a load current waveform 412, and a flyback detection signal (FB_Det) 414, which are generated for a dimming power level setting of 50% in which the load current is terminated (via deactivation of the AC switch 110) before the time of the zero-current crossing of the load current, in which case inductive flyback voltage is detected. In the illustrative embodiment of FIG. 4B, it is assumed that the load current is terminated (via deactivation of the AC switch 110) at 175 microseconds after the occurrence of a zero-voltage crossing of the load voltage, which is before the target delay time of 275 microseconds after the occurrence of a zero-voltage crossing of the load voltage, where is it assumed that the zero-current crossing of the load current occurs. FIG. 4B illustrates various points in time $t_1$, $t_2$, $t_3$, $t_4$, $t_5$, and $t_6$ that denote certain events.

For example, at time $t_1$, it is assumed that the AC switch 110 is activated (turned on), which causes the exemplary load voltage waveform 410 to abruptly increase from 0V to a peak voltage of 170V, and which causes the load current waveform 412 to increase. Similar to the simulated timing diagrams of FIG. 4A, as shown in FIG. 4B, at time $t_1$, the flyback detection signal 414 (FB_Det) includes a false positive FB_Det pulse 414-1 which is generated by the inductive flyback voltage detector for reasons as discussed above. Again, the false positive FB_Det pulse 414-1 is essentially a false positive flyback detection signal which is ignored by the controller 122.

Next, time $t_2$ represents the time of a zero-voltage crossing of the load voltage waveform 410 (i.e., when the load voltage is 0 V). As shown in FIG. 4B, at time $t_2$, the load current waveform 412 is greater than 0 A (e.g., about +5 A), due to the fact that the load current lags the load voltage for the inductive load. Next, at time $t_3$, the AC switch 110 is turned off (which terminates the load current). In this instance, as noted above, it is assumed that the AC switch 110 is turned off before the time of the zero-current crossing of the load current waveform 412. For example, the load current waveform 412 is about 1 A at the time $t_3$ when the AC switch 110 is turned off. As noted above, it is assumed that time $t_3$ is 175 microseconds after the time $t_2$ of the occurrence of the zero-voltage crossing of the load voltage waveform 410, which is before the target delay time of 275 microseconds after the occurrence of a zero-voltage crossing of the load voltage waveform 410, where is it assumed that the zero-current crossing of the load current waveform 412 occurs. In this instance, a relatively large negative inductive flyback voltage 410-1 is generated at time $t_3$ (e.g., a negative inductive voltage spike greater than −200 V). Since the magnitude of the inductive flyback voltage 410-1 is negative, for reasons as discussed above, the inductive flyback voltage detector will not generate a FB_Det pulse at time $t_3$. In this instance, at time $t_3$, the FB_Det signal 414 remains at a logic "0" level (e.g., 0V) despite the presence of the large negative inductive flyback voltage spike 410-1 in the load voltage waveform 410.

Next, at time $t_4$, it is assumed that the AC switch 110 is activated (turned on), which causes the exemplary load voltage waveform 410 to abruptly transition from 0 V to a negative peak voltage of −170 V, and which causes the load current waveform 412 to increase in a negative direction. As noted above, for a 50% dimming power level setting, the controller 122 activates the AC switch 110 at the mid-point of each positive and negative half-cycle of the AC supply voltage waveform. Again, it is to be noted that at time $t_4$, a false positive FB_Det pulse is not generated in the flyback detection signal 414 for reasons as discussed above. Next, time $t_5$ represents the time of a zero-voltage crossing of the load voltage waveform 410 (i.e., when the load voltage is 0 V). As shown in FIG. 4B, at time $t_5$, the load current waveform 412 is less than 0 A (e.g., about −5 A), due to the fact that the load current lags the load voltage for the inductive load.

Next, at time $t_6$, the AC switch 110 is turned off (which terminates the load current). In this instance, as noted above, it is assumed that the AC switch 110 is turned off before the time of the zero-current crossing of the load current waveform 412. For example, the load current waveform 412 is about −1 A at the time $t_6$ when the AC switch 110 is turned off. As noted above, it is assumed that time $t_6$ is 175 microseconds after the time $t_5$ of the occurrence of the zero-voltage crossing of the load voltage waveform 410, which is before the target delay time of 275 microseconds after the occurrence of a zero-voltage crossing of the load voltage waveform 410, where is it assumed that the zero-current crossing of the load current waveform 412 occurs. In this instance, a relatively large positive inductive flyback voltage 410-2 is generated at time $t_6$ (e.g., a positive inductive voltage spike greater than +200 V). Since the magnitude of the inductive flyback voltage 410-2 is positive and greater than the inductive flyback voltage threshold (e.g., 30 V), the inductive flyback voltage detector will generate a FB_Det pulse 414-2 at time $t_6$ due to the presence of the large inductive flyback voltage spike 410-2 in the load voltage waveform 410.

In this instance, the occurrence of the FB_Det pulse 414-2 at time $t_6$, which results from the AC switch 110 being turned off at some time after the zero-voltage crossing of the transition from a negative half-cycle to a positive half-cycle of the AC supply voltage waveform, provides an indication to the controller 122 that the AC switch 110 was turned off too soon (before the zero-current crossing of the load current waveform 412), resulting in the unwanted inductive flyback voltage spike 410-2. In this regard, since the controller 122 determines that the AC switch 110 was deactivated before the time of the zero-current crossing of the load current, the controller 122 can adjust (i.e., increase) the delay time for turning off the AC switch 110 subsequent to the time of a zero-voltage crossing, to reach the target state of calibration as shown in FIG. 4A.

Next, FIG. 4C depicts simulated timing diagrams of an exemplary load voltage waveform 420, a load current waveform 422, and a flyback detection signal (FB_Det) 424, which are generated for a dimming power level setting of 50% in which the load current is terminated (via deactivation of the AC switch 110) after the time of the zero-current crossing of the load current, in which case inductive flyback voltage is detected. In the illustrative embodiment of FIG. 4C, it is assumed that the load current is terminated at a time of 375 microseconds after the time of occurrence of a zero-voltage crossing of the load voltage, which is after the target delay time of 275 microseconds after the occurrence of a zero-voltage crossing of the load voltage, where is it assumed that the zero-current crossing of the load current occurs. FIG. 4C illustrates various points in time $t_1$, $t_2$, $t_3$, $t_4$, $t_5$, and $t_6$ that denote certain events.

For example, at time $t_1$, it is assumed that the AC switch 110 is activated (turned on), which causes the exemplary load voltage waveform 420 to abruptly increase from 0V to a peak voltage of 170V, and which causes the load current waveform 422 to increase. Similar to the simulated timing diagrams of FIGS. 4A and 4B, as shown in FIG. 4C, at time $t_1$, the flyback detection signal 424 (FB_Det) includes a false positive FB_Det pulse 424-1 which is generated by the inductive flyback voltage detector for reasons as discussed above. Again, the FB_Det pulse 424-1 is essentially a false positive flyback detection signal which is ignored by the controller 122.

Next, time $t_2$ represents the time of a zero-voltage crossing of the load voltage waveform 420 (i.e., when the load voltage is 0 V). As shown in FIG. 4C, at time $t_2$, the load current waveform 422 is greater than 0 A (e.g., about +5 A), due to the fact that the load current lags the load voltage for the inductive load. Next, at time $t_3$, the AC switch 110 is turned off (which terminates the load current and causes the load current waveform 422 to become zero). In this instance, as noted above, it is assumed that the AC switch 110 is turned off after the time of the zero-current crossing of the load current waveform 422. For example, the load current waveform 422 is about −1 A at the time $t_3$ when the AC switch 110 is turned off. As noted above, it is assumed that time $t_3$ is 375 microseconds after the time $t_2$ of the occurrence of the zero-voltage crossing of the load voltage waveform 420, which is after the target delay time of 275 microseconds after the occurrence of a zero-voltage crossing of the load voltage waveform 420, where is it assumed that the zero-current crossing of the load current waveform 422 occurs. In this instance, a relatively large positive inductive flyback voltage 420-1 is generated at time $t_3$ (e.g., a positive inductive voltage spike greater than 200 V). Since the magnitude of the inductive flyback voltage 420-1 is positive and greater than the inductive flyback voltage threshold (e.g., 30 V), the inductive flyback voltage detector will generate a FB_Det pulse 424-2 at time $t_3$ due to the presence of the large positive inductive flyback voltage spike 420-1 in the load voltage waveform 420.

Next, at time $t_4$, it is assumed that the AC switch 110 is activated (turned on), which causes the exemplary load voltage waveform 420 to abruptly transition from 0 V to a negative peak voltage of −170 V, and which causes the load current waveform 422 to increase in a negative direction. As noted above, for a 50% dimming power level setting, the controller 122 activates the AC switch 110 at the mid-point of each positive and negative half-cycle of the AC supply voltage waveform. Again, it is to be noted that at time $t_4$, a false positive FB_Det pulse is not generated in the flyback detection signal 424 for reasons as discussed above. Next, time $t_5$ represents the time of a zero-voltage crossing of the load voltage waveform 420 (i.e., when the load voltage is 0 V). As shown in FIG. 4C, at time $t_5$, the load current waveform 422 is less than 0 A (e.g., about −5 A), due to the fact that the load current lags the load voltage for the inductive load.

Next, at time $t_6$, the AC switch 110 is turned off (which terminates the load current). In this instance, as noted above, it is assumed that the AC switch 110 is turned off after the time of the zero-current crossing of the load current waveform 422. For example, the load current waveform 422 is about +1 A at the time $t_6$ when the AC switch 110 is turned off. As noted above, it is assumed that time $t_6$ is 375 microseconds after the time $t_5$ of the occurrence of the zero-voltage crossing of the load voltage waveform 420, which is later than the target delay time of 275 microseconds after the occurrence of a zero-voltage crossing of the load voltage waveform 420, where is it assumed that the zero-current crossing of the load current waveform 422 occurs. In this instance, a relatively large negative inductive flyback voltage 420-2 is generated at time $t_6$ (e.g., a negative inductive voltage spike greater than −200 V). Since the magnitude of the inductive flyback voltage 420-2 negative, for reasons as discussed above, the inductive flyback voltage detector will not generate a FB_Det pulse at time $t_6$. In this instance, at time $t_6$, the FB_Det signal 424 remains at a logic "0" level (e.g., 0V) despite the presence of the large negative inductive flyback voltage spike 420-2 in the load voltage waveform 420.

In this instance, the occurrence of the FB_Det pulse 424-2 at time $t_3$, which results from the AC switch 110 being turned off at some time after the zero-voltage crossing of the transition from a positive half-cycle to a negative half-cycle of the AC supply voltage waveform, provides an indication to the controller 122 that the AC switch 110 was turned off too late (after the time of the zero-current crossing of the load current waveform 422), resulting in the unwanted inductive flyback voltage spike 420-1. In this regard, since the controller 122 determines that the AC switch 110 was turned off too late, the controller 122 can adjust (i.e., decrease) the delay time for turning off the AC switch 110 following the time of a zero-voltage crossing of the AC supply voltage waveform, to reach the target state of calibration as shown in FIG. 4A.

FIGS. 4B and 4C illustrate an exemplary embodiment in which the controller 122 can determine whether to increase or decrease the delay time for shutting of the AC switch 110 following the time of a zero-voltage crossing of an AC supply voltage waveform, depending on whether a flyback detection pulse FB_Det is generated when (i) the AC switch 110 is turned off after the transition from a positive half-cycle to a negative half-cycle of the AC supply voltage waveform or (ii) the AC switch 110 is turned off after the transition from a negative half-cycle to a positive half-cycle of the AC supply voltage waveform. While FIGS. 4A, 4B, and 4C illustrate a calibration routine for a dimming power level setting of 50%, as noted above, the same calibration routine can be implemented as part of an automated calibration process that is performed by the controller 122 to determine, for each dimming power level setting of a plurality of dimming power level settings in a range from 0% to 100%, a proper delay time to turn-off the AC switch 110 following a zero-voltage crossing of the AC supply voltage waveform to ensure that the AC switch 110 is turned off at a time that is the same or substantially the same as the time of the zero-current crossing of the load current. For dimming power level settings less than 50%, the AC switch 110 will be turned on at certain points in time during the positive and negative half-cycles after the peak voltage times of the AC supply voltage waveform, while for dimming power level settings greater than 50%, the AC switch 110 will be turned on at certain points in time during the positive and negative half-cycles before the peak voltage times of the AC supply voltage waveform.

Figure 5:
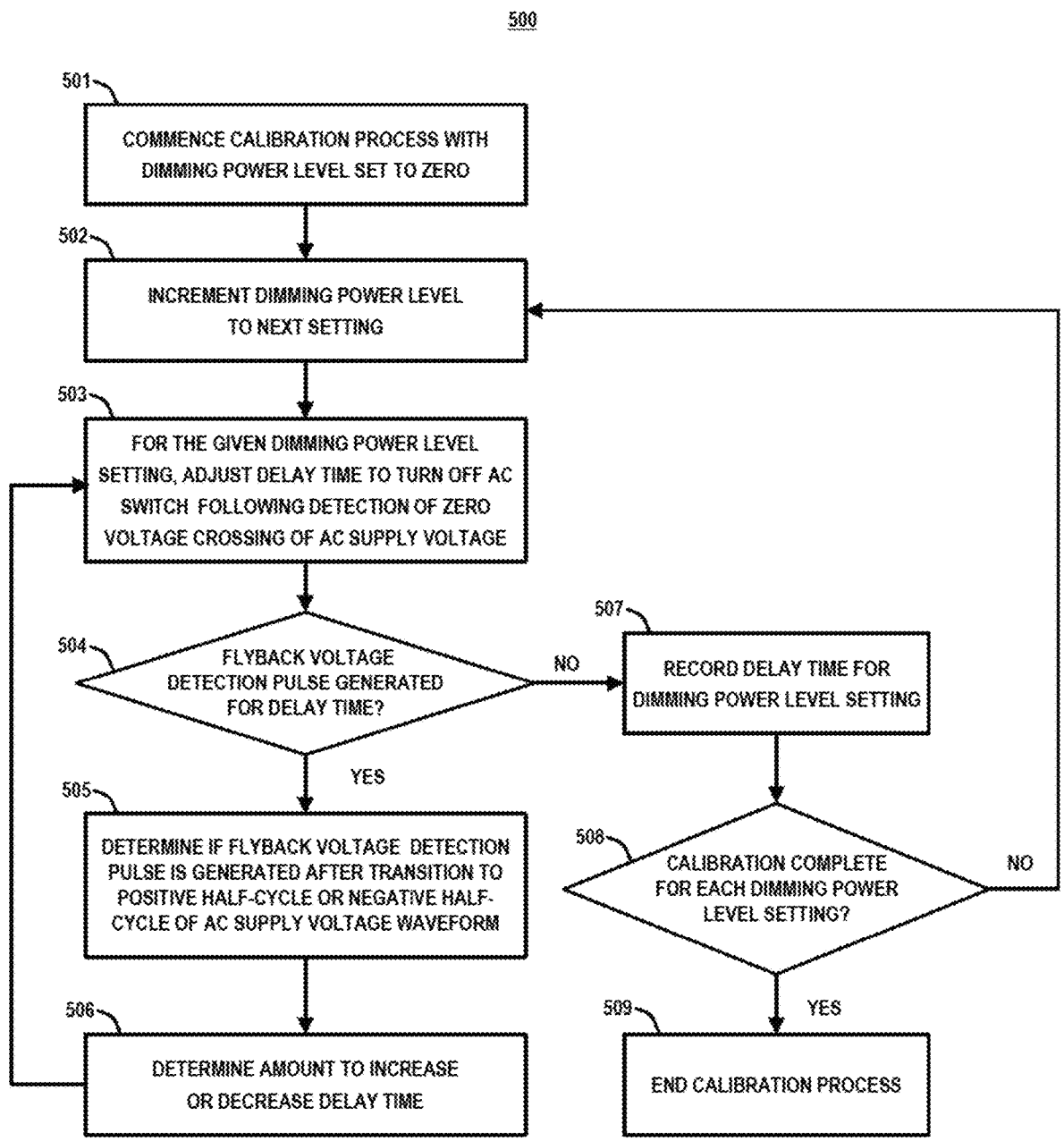
FIG. 5 illustrates a flow diagram of an automated calibration process to calibrate a deactivation time of an AC switch which supplies AC power to an inductive load, to protect against inductive flyback voltage for each of a plurality of dimming power level settings, according to an exemplary embodiment of the disclosure.

FIG. 5 illustrates a flow diagram of an automated calibration process 500 to calibrate a deactivation time of an AC switch, which supplies AC power to an inductive load, to protect against inductive flyback voltage for each of a plurality of dimming power level settings, according to an exemplary embodiment of the disclosure. In some embodiments, the calibration process 500 is performed by the intelligent switch control system 120 of the device 100 of FIG. 1 where in some embodiments, the device 100 is an intelligent electric switch device with intelligent dimming control functionality to modulate the amount of power that is applied to, e.g., a magnetic low-voltage transformer which drives low-voltage lighting. In some embodiments, for intelligent dimming control, the controller 122 is configured to adjust the dimming power level settings in relatively small incremental settings (e.g., 2.5% increments) from a range of 0% (where the AC switch 110 is turned off to supply no AC power to the inductive load) to 100% (where the AC switch 110 remains turned on to supply full AC power to the inductive load).

Referring to FIG. 5, as an initial step, the controller 122 will commence the calibration process with the dimming power level set to zero, e.g., 0% dimming power level in which the controller 122 places the AC switch 110 in a switched-off state (block 501). In some embodiments, the calibration process 500 is commenced upon power up of the intelligent switch control system 120 (e.g., when AC power is first applied to the device 100). It is to be noted that the calibration process 500 is specific to the given inductive load 20 which is powered by the device 100. In this regard, the calibration data that is obtained for a given inductive load can be different for another inductive load.

After initialization, the controller 122 will increment the dimming power level to the next setting (block 502) and then for the given dimming power level setting, the controller 122 will adjust/set the delay time to turn off the AC switch 110 following the detection of zero-voltage crossings of the AC supply voltage waveform (block 503). For example, at the initial stage of calibration, the controller 122 will increment the dimming power level setting from zero to, e.g., a 2.5% dimming power level setting. In addition, for the initial dimming power level setting of, e.g., 2.5%, the controller 122 can set the delay time to be zero, such that the AC switch 110 will be turned off at the time of the zero-voltage crossing of the AC supply voltage waveform at the end of each positive and negative half-cycle. The selection of these initial settings is based on various factors.

For example, for an inductive load, the degree (conduction angle) to which the load current lags the load voltage increases with increasing dimming power level settings. For example, at a low dimming power level (e.g., 20% or less), the load current may lag the load voltage by 100 microseconds or less. On the other hand, at a high dimming power level (e.g., 80% or more), the load current may lag the load voltage on the order of hundreds of microseconds or greater than 1000 microseconds (e.g., a current lag of 1.25 ms). In this regard, for the first incremental dimming power level setting (e.g., 2.5%) following the zero setting, it can be assumed that the load current lag is relatively small such that the time of the zero-current crossing of the load current is close in time to the time of the zero-voltage crossing of the AC supply voltage waveform.

Furthermore, at the low dimming power level setting (e.g., 2.5%), the magnitude of any potential inductive flyback voltage that may be generated as a result of the initial delay time setting for turning off the AC switch 110 will most likely be relatively small and not potentially destructive to the AC switch 110. Therefore, for the initial low dimming power level setting (e.g., 2.5%), the initial delay time for turning off the AC switch 110 can be set to zero (0) such that the turn off time of the AC switch 110 coincides with the time of the zero-voltage crossing of the AC supply voltage waveform, without having to worry about the generation of potentially destructive inductive flyback voltage if the initial delay time setting results in the generation of inductive flyback voltage on the load voltage. In addition, by performing an iterative calibration process starting from the zero dimming power level setting and incrementally increasing the dimming power level setting from zero to the maximum dimming power level setting, the calibrated delay time that is determined for turning off the AC switch 110 for a given dimming power level setting can be utilized as a baseline for the initial estimated delay time setting for the next dimming power level such that any error between the initial estimated delay time setting and the properly calibrated delay time setting for the next dimming power level will most likely result, at most, in the generation of non-destructive inductive flyback voltage.

Referring back to FIG. 5, once the initial delay time setting is applied for the given dimming power level setting being calibrated, the controller 122 will monitor the output of the inductive flyback voltage detector 123 to determine if a flyback voltage detection pulse is generated for the delay time setting for the given dimming power level setting (block 504). As noted above, if the delay time setting for turning off the AC switch 110 does not coincide with the time of the zero-current crossing of the load current, the deactivation of the of the AC switch 110 will result in the generation of inductive flyback voltage in the load voltage waveform. If the magnitude of the inductive flyback voltage exceeds a flyback voltage threshold, the inductive flyback voltage detector 123 will generate a FB_Det pulse which input to the controller 122.

If the controller 122 determines that a flyback voltage detection pulse was generated as a result of the delay time setting for the given dimming power level setting (affirmative determination in block 504), the controller 122 will determine whether the flyback detection pulse was generated in response to deactivation of the AC switch 110 at some time after a transition to a positive half-cycle or after a transition to negative half-cycle of the AC supply voltage waveform (block 505) and then determine an amount of time by which to increase or decrease the given delay time setting depending on when the flyback detection pulse was generated (block 506).

For example, as discussed above in conjunction with FIG. 4B, if the flyback voltage detection pulse FB_Det is generated at a time when the AC switch 110 is turned off after the zero-voltage crossing transition from a negative half-cycle to a positive half-cycle of the AC supply voltage waveform, the controller 122 will determine that the delay time for turning off the AC switch is too early, and then proceed to determine an amount of time to increase the current delay time setting so that the new delay time setting coincides with the time of the zero-current crossing of the load current. On the other hand, as discussed above in conjunction with FIG. 4C, if the flyback voltage detection pulse FB_Det is generated at a time when the AC switch 110 is turned off after the zero-voltage crossing transition from a positive half-cycle to a negative half-cycle of the AC supply voltage waveform, the controller 122 will determine that the delay time for turning off the AC switch 110 is too late, and then proceed to determine an amount of time to decrease the current delay time setting so that the new delay time setting coincides with the time of the zero-current crossing of the load current.

The controller 122 will then proceed, for the given dimming power level setting, to adjust (e.g., increase or decrease) the delay time setting for deactivating the AC switch 110 after the zero-voltage crossings of the AC supply voltage (return to block 503). Once the proper delay time setting has been calibrated, and the controller 122 determines that no flyback voltage detection pulse FB_Det is generated for the adjusted delay time (negative determination in block 504), the controller 122 will proceed to record the calibrated delay time setting for the given dimming power level setting in memory (block 507). The controller 122 will then determine whether the calibration process has been completed for each dimming power level setting (block 508). If the calibration process is not completed and one or more dimming power level settings still need to be calibrated (negative determination in block 508), the controller 502 will proceed to increment the dimming power level to the next setting (block 502), and the calibration process (blocks 503, 504, 505, 506, and 507) are repeated for the next dimming power level setting. On the other hand, if the controller 122 determines that the calibration process is completed for each dimming power level setting (affirmative determination in block 508), the controller 122 will terminate the calibration process (block 509).

In some embodiments, at the completion of the calibration process, the one or more memory devices 125 will have a data structure (e.g., persistent table data structure) which comprises the calibration data that was determined and recorded as a result of the calibration process 500 of FIG. 5. In some embodiments, the calibration data comprises the calibrated turn-off time for the AC switch 110 for each dimming power level setting, wherein the calibrated AC switch turn-off time for a given dimming power level setting corresponds to the delay time for turning off the AC switch 110 subsequent to a zero-voltage crossing of the AC supply voltage waveform. As noted above, the calibrated turn-off time of the AC switch 110 for a given dimming power level setting is the same or substantially the same as the time of the zero-current crossing of the load current for the given dimming power level setting, which prevents the generation of destructive inductive flyback voltage for the given dimming power level setting.

During real-time use of the intelligent dimmer switch, when a user changes the dimming power level setting by operation of a dimmer element of the intelligent dimmer switch, the controller 122 can access the calibration data in memory to determine the proper calibrated turn-off time of the AC switch 110 for the user-selected dimming power level setting. In addition, during real time operation of the intelligent dimmer switch, the controller 122 will monitor the output of the inductive flyback voltage detector 123 to determine if a flyback voltage detection pulse FB_Det is generated at the given user-selected dimming power level setting, despite the calibrated delay time. If a flyback voltage detection pulse FB_Det is generated while operating at the user-selected dimming power level setting, the controller 122 can proceed to adjust the delay time for the user-selected dimming power level setting by performing a calibration process which is the same or similar to that discussed above in conjunction with FIG. 5. In addition, when the user activates the switch on/off element to turn off power to the inductive load, the controller 122 will receive a switch turn off signal that is generated as a result of the user activating the switch on/off element to turn off the power, and then delay the actual turn-off of the dimmer switch at the next zero-current crossing of the load current, as determined based on the timing information known to the controller 122. In this manner, the power to the inductive load will be terminated at a time of the zero-current crossing of the load current, and not the time when the actual turn-off command is received by the controller 122.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a power input terminal configured for connection to an alternating current (AC) supply voltage, and a load output terminal configured to connection to an inductive load;
   an AC switch connected in an electrical path between the power input terminal and the load output terminal, wherein the AC switch is configured to be placed into one of a turned-on state to couple the AC supply voltage to the inductive load, and a turned-off state to decouple the AC supply voltage from the inductive load; and
   a control system configured to (i) generate a switch control signal to place the AC switch into one of the turned-on state and the turned-off state, (ii) detect zero-voltage crossings of the AC supply voltage when connected to the power input terminal, (iii) monitor a load voltage of the inductive load when connected to the load output terminal to detect for a presence of inductive flyback voltage in the load voltage when the AC switch is placed into the turned-off state, and (iv) in response to detecting the presence of inductive flyback voltage in the load voltage, determine a delay time to place the AC switch into the turned-off state subsequent to a detected zero-voltage crossing of the AC supply voltage, so that the AC switch placed into the turned-off state at a time which substantially coincides with a zero-current crossing of load current of the inductive load, to thereby suppress the generation of inductive flyback voltage when the AC switch is placed into the turned-off state.

2. The device of claim 1, wherein the AC switch comprise a bidirectional solid-state switch.

3. The device of claim 1, wherein the control system comprises:
a voltage phase detector which is configured to a detect zero-voltage crossings of the AC supply voltage and phase transition directions at the detected zero-voltage crossings of the AC supply voltage and generate phase detection signals which indicate the zero-voltage crossings and the phase transition directions of the AC supply voltage;
an inductive flyback voltage detector which is configured to monitor the load voltage of the inductive load when connected to the load output terminal to detect inductive flyback voltage in the load voltage, and generate a flyback voltage detection signal when the inductive flyback voltage is generated in the load voltage when the AC switch is placed into the turned-off state; and
a hardware controller configured to utilize the flyback voltage detection signal and the phase detection signals to determine the delay time to place the AC switch into the turned-off state to thereby suppress the generation of inductive flyback voltage when AC switch is placed into the turned-off state.

4. The device of claim 3, wherein the inductive flyback voltage detector is configured to compare a magnitude of the inductive flyback voltage to a flyback voltage threshold, and generate the flyback voltage detection signal when the magnitude of the inductive flyback voltage exceeds the flyback voltage threshold.

5. The device of claim 3, wherein the inductive flyback voltage detector comprises a high pass filter circuit which is configured to filter the load voltage to isolate the inductive flyback voltage from frequency components of the AC supply voltage.

6. The device of claim 3, wherein the hardware controller is configured to utilize the phase detection signals to determine whether a given flyback detection signal is generated in response to placing the AC switch into the turned-off state at some time after a transition to a positive half-cycle or after a transition to negative half-cycle of the AC supply voltage, and determine an amount to increase or decrease the delay time to place the AC switch into the turned-off state.

7. The device of claim 6, wherein the hardware controller is configured to (i) determine that the delay time for placing the AC switch into the turned-off state is too early when the given flyback voltage detection signal is generated at a time when the AC switch is turned off after a zero-voltage crossing transition from a negative half-cycle to a positive half-cycle of the AC supply voltage, and (ii) increase the delay time for turning off the AC switch so that the turn off time of the AC switch coincides with the time of the zero-current crossing of the load current.

8. The device of claim 6, wherein the hardware controller is configured to (i) determine that the delay time for placing the AC switch into the turned-off state is too late when the given flyback voltage detection signal is generated at a time when the AC switch is turned off after a zero-voltage crossing transition from a positive half-cycle to a negative half-cycle of the AC supply voltage, and (ii) decrease the delay time for turning off the AC switch so that the turn off time of the AC switch coincides with the time of the zero-current crossing of the load current.

9. The device of claim 1, wherein the device comprises an intelligent light dimmer switch device.

10. An intelligent light dimmer device, comprising:
a power input terminal configured for connection to an alternating current (AC) supply voltage, and a load output terminal configured to connection to an inductive load comprising a magnetic low-voltage transformer which is configured to drive low voltage lighting;
an AC switch connected in an electrical path between the power input terminal and the load output terminal, wherein the AC switch is configured to be placed into one of a turned-on state to couple the AC supply voltage to the inductive load, and a turned-off state to decouple the AC supply voltage from the inductive load; and
a control system configured to (i) generate a switch modulation control signal to switch the AC switch between the turned-on state and the turned-off state to modulate an amount of AC power that is delivered to the inductive load based on a given dimming power level setting, (ii) detect zero-voltage crossings of the AC supply voltage when connected to the power input terminal, (iii) monitor a load voltage of the inductive load when connected to the load output terminal to detect for a presence of inductive flyback voltage in the load voltage when the AC switch is switched between the turned-on state and the turned-off state for the given dimming power level setting, and (iv) in response to detecting the presence of inductive flyback voltage in the load voltage, determine for the given dimming power level setting, a delay time to place the AC switch into the turned-off state subsequent to each detected zero-voltage crossing of the AC supply voltage, so that the AC switch placed into the turned-off state at each time that substantially coincides with a zero-current crossing of load current of the inductive load, to thereby suppress the generation of inductive flyback voltage when the AC switch is switched between the turned-on state and the turned-off state for the given dimming power level setting.

11. The intelligent light dimmer device of claim 10, wherein the AC switch comprise a bidirectional solid-state switch.

12. The intelligent light dimmer device of claim 10, wherein the control system comprises:
a voltage phase detector which is configured to a detect zero-voltage crossings of the AC supply voltage and phase transition directions at the detected zero-voltage crossings of the AC supply voltage and generate phase detection signals which indicate the zero-voltage crossings vent and the phase transition directions of the AC supply voltage;
an inductive flyback voltage detector which is configured to monitor the load voltage of the inductive load when connected to the load output terminal to detect inductive flyback voltage in the load voltage, and generate a flyback voltage detection signal when the inductive flyback voltage is detected to be generated in the load voltage when the AC switch is switched between the turned-on state and the turned-off state for the given dimming power level setting;

a hardware controller configured to utilize the flyback voltage detection signal and the phase detection signals to determine the delay time to place the AC switch into the turned-off state to thereby suppress the generation of inductive flyback voltage when the AC switch is switched between the turned-on state and the turned-off state for the given dimming power level setting.

13. The intelligent light dimmer device of claim 12, wherein the inductive flyback voltage detector is configured to compare a magnitude of the inductive flyback voltage to a flyback voltage threshold, and generate the flyback voltage detection signal when the magnitude of the inductive flyback voltage exceeds the flyback voltage threshold.

14. The intelligent light dimmer device of claim 12, wherein the inductive flyback voltage detector comprises a high pass filter circuit which is configured to filter the load voltage to isolate the inductive flyback voltage from frequency components of the AC supply voltage.

15. The intelligent light dimmer device of claim 12, wherein the hardware controller is configured to utilize the phase detection signals to determine whether a given flyback detection signal is generated in response to placing the AC switch into the turned-off state at some time after a transition to a positive half-cycle or after a transition to negative half-cycle of the AC supply voltage, and determine an amount to increase or decrease the delay time to place the AC switch into the turned-off state.

16. The intelligent light dimmer device of claim 15, wherein the hardware controller is configured to (i) determine that the delay time for placing the AC switch into the turned-off state is too early when the given flyback voltage detection signal is generated at a time when the AC switch is turned off after a zero-voltage crossing transition from a negative half-cycle to a positive half-cycle of the AC supply voltage, and (ii) increase the delay time for turning off the AC switch so that the turn off time of the AC switch coincides with the time of the zero-current crossing of the load current.

17. The intelligent light dimmer device of claim 15, wherein the hardware controller is configured to (i) determine that the delay time for placing the AC switch into the turned-off state is too late when the given flyback voltage detection signal is generated at a time when the AC switch is turned off after a zero-voltage crossing transition from a positive half-cycle to a negative half-cycle of the AC supply voltage, and (ii) decrease the delay time for turning off the AC switch so that the turn off time of the AC switch coincides with the time of the zero-current crossing of the load current.

18. The intelligent light dimmer device of claim 12, wherein the hardware controller is configured to execute a calibration process upon power up of the intelligent light dimmer device to determine a delay time to place the AC switch into the turned-off state to thereby suppress the generation of inductive flyback voltage when the AC switch is switched between the turned-on state and the turned-off state for each of a plurality of dimming power level settings, and record the determined delay times for each of the dimming power level settings in memory.

19. A method, comprising:
controlling alternating current (AC) power which is supplied to an inductive load by operation of an AC switch;
detecting zero-voltage crossings of an AC voltage waveform of the AC power;
generating a control signal to place a solid-state switch into a turned-off state;
monitoring a load voltage of the inductive load to detect for a presence of inductive flyback voltage in the load voltage when the AC switch is placed into the turned-off state; and
in response to detecting the presence of inductive flyback voltage in the load voltage, determine a delay time to place the AC switch into the turned-off state subsequent to a detected zero-voltage crossing of the AC voltage waveform, so that the AC switch placed into the turned-off state at a time which substantially coincides with a zero-current crossing of load current of the inductive load, to thereby suppress the generation of inductive flyback voltage when the AC switch is placed into the turned-off state.

20. The method of claim 19, wherein:
detecting zero-voltage crossings of an AC voltage waveform of the AC power further comprises detecting phase transition directions at the detected zero-voltage crossings of the AC voltage waveform; and
the method further comprises:
generating phase detection signals which indicate the zero-voltage crossings and the phase transition directions of the AC voltage waveform;
generating a flyback voltage detection signal when the inductive flyback voltage is detected to be generated in the load voltage when the AC switch is placed into the turned-off state; and
utilizing the flyback voltage detection signal and the phase detection signals to determine the delay time to place the AC switch into the turned-off state to thereby suppress the generation of inductive flyback voltage when AC switch is placed into the turned-off state.

* * * * *